United States Patent
Haba et al.

(10) Patent No.: US 12,176,264 B1
(45) Date of Patent: Dec. 24, 2024

(54) MANIFOLD DESIGNS FOR EMBEDDED LIQUID COOLING IN A PACKAGE

(71) Applicant: Adeia Semiconductor Bonding Technologies Inc., San Jose, CA (US)

(72) Inventors: Belgacem Haba, Saratoga, CA (US); Gaius Gillman Fountain, Jr., Youngsville, NC (US); Laura Mirkarimi, Sunol, CA (US); Ron Zhang, Sunnyvale, CA (US); Rajesh Katkar, Milpitas, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 0 days.

(21) Appl. No.: 18/674,581

(22) Filed: May 24, 2024

Related U.S. Application Data

(60) Provisional application No. 63/571,796, filed on Mar. 29, 2024.

(51) Int. Cl.
  *H01L 23/473* (2006.01)
  *H01L 23/00* (2006.01)
  (Continued)

(52) U.S. Cl.
  CPC .......... *H01L 23/473* (2013.01); *H01L 23/053* (2013.01); *H01L 23/3142* (2013.01);
  (Continued)

(58) Field of Classification Search
  CPC ..... H01L 23/473; H01L 23/053; H01L 23/36; H01L 24/08; H01L 24/16; H01L 24/32;
  (Continued)

(56) References Cited

U.S. PATENT DOCUMENTS

| 4,274,479 A | 6/1981 | Eastman |
| 5,309,986 A | 5/1994 | Itoh |

(Continued)

FOREIGN PATENT DOCUMENTS

| CN | 109524373 A | 3/2019 |
| CN | 111128976 A | 5/2020 |

(Continued)

OTHER PUBLICATIONS

Evan G. Colgan, "A Practical Implementation Of Silicon Microchannel Coolers", available online at <https://www.electronics-cooling.com/2007/11/a-practical-implementation-of-silicon-microchannel-coolers/>, Nov. 1, 2007, 10 pages.

(Continued)

*Primary Examiner* — Jasmine J Clark
(74) *Attorney, Agent, or Firm* — HALEY GUILIANO LLP

(57) ABSTRACT

A device package comprising a cooling system. The cooling system comprises a first substrate, a first semiconductor device located on a first region of the first substrate, a second semiconductor device located on a second region of the first substrate, a first cold plate attached to the first semiconductor device, a second cold plate attached to the second semiconductor device, and a manifold having a first chamber volume and a second chamber volume. The first chamber volume comprises a first inlet coupled to a first coolant line, a first outlet coupled to the first cold plate, and a second outlet coupled to the second cold plate. The second chamber volume comprises a third outlet coupled to a second coolant line, a second inlet coupled to the first cold plate, and a third inlet coupled to the second cold plate.

20 Claims, 23 Drawing Sheets

(51) Int. Cl.
*H01L 23/053* (2006.01)
*H01L 23/31* (2006.01)
*H01L 23/36* (2006.01)
*H01L 25/065* (2023.01)

(52) U.S. Cl.
CPC .......... *H01L 23/36* (2013.01); *H01L 25/0655* (2013.01); *H01L 24/08* (2013.01); *H01L 24/16* (2013.01); *H01L 24/32* (2013.01); *H01L 24/73* (2013.01); *H01L 2224/08245* (2013.01); *H01L 2224/16225* (2013.01); *H01L 2224/32225* (2013.01); *H01L 2224/73204* (2013.01)

(58) Field of Classification Search
CPC . H01L 2444/08245; H01L 2444/16225; H01L 2444/32225; H01L 2444/73204
USPC ....................................................... 257/687
See application file for complete search history.

(56) References Cited

U.S. PATENT DOCUMENTS

| | | | |
|---|---|---|---|
| 5,522,452 | A | 6/1996 | Mizuno et al. |
| 5,769,154 | A | 6/1998 | Adkins et al. |
| 6,056,044 | A | 5/2000 | Benson et al. |
| 6,351,384 | B1 | 2/2002 | Daikoku et al. |
| 6,686,532 | B1 | 2/2004 | Macris |
| 6,822,326 | B2 | 11/2004 | Enquist et al. |
| 7,289,326 | B2 | 10/2007 | Heydari et al. |
| 7,485,957 | B2 | 2/2009 | Brandenburg et al. |
| 7,511,372 | B2 | 3/2009 | Chiu |
| 7,523,617 | B2 | 4/2009 | Venkatasubramanian et al. |
| 7,622,324 | B2 | 11/2009 | Enquist et al. |
| 7,692,926 | B2 | 4/2010 | Henderson et al. |
| 7,957,137 | B2 | 6/2011 | Prasher |
| 7,978,473 | B2 | 7/2011 | Campbell et al. |
| 7,997,087 | B2 | 8/2011 | Venkatasubramanian et al. |
| 8,164,169 | B2 | 4/2012 | Chrysler et al. |
| 8,630,091 | B2 | 1/2014 | Ward et al. |
| 9,224,673 | B2 | 12/2015 | Chen et al. |
| 9,299,641 | B2 | 3/2016 | Sekar et al. |
| 9,355,932 | B2 | 5/2016 | Ankireddi et al. |
| 9,391,143 | B2 | 7/2016 | Tong et al. |
| 9,553,071 | B1 | 1/2017 | Haba |
| 9,741,638 | B2 | 8/2017 | Hsieh et al. |
| 9,741,696 | B2 | 8/2017 | Katkar et al. |
| 9,746,248 | B2 | 8/2017 | Semenov et al. |
| 9,768,149 | B2 | 9/2017 | Vadhavkar et al. |
| 9,818,723 | B2 | 11/2017 | Haba |
| 10,032,695 | B2 | 7/2018 | Iyengar et al. |
| 10,083,934 | B2 | 9/2018 | Haba |
| 10,157,818 | B2 | 12/2018 | Chen et al. |
| 10,170,392 | B2 | 1/2019 | Chainer et al. |
| 10,199,356 | B2 | 2/2019 | Kinsley |
| 10,312,221 | B1 | 6/2019 | Agarwal et al. |
| 10,332,823 | B2 | 6/2019 | Chen et al. |
| 10,461,059 | B2 | 10/2019 | Koopmans et al. |
| 10,694,641 | B2 | 6/2020 | Basu et al. |
| 10,978,427 | B2 | 4/2021 | Li et al. |
| 11,187,469 | B2 | 11/2021 | Karesh |
| 11,387,164 | B2 | 7/2022 | Wu et al. |
| 11,598,594 | B2 | 3/2023 | Lewis et al. |
| 11,996,351 | B2 | 5/2024 | Hsiao et al. |
| 2003/0157782 | A1 | 8/2003 | Kellar et al. |
| 2004/0184237 | A1 | 9/2004 | Chang |
| 2004/0251530 | A1 | 12/2004 | Yamaji |
| 2005/0126766 | A1 | 6/2005 | Lee et al. |
| 2005/0213301 | A1 | 9/2005 | Prasher |
| 2006/0042825 | A1 | 3/2006 | Lu et al. |
| 2006/0103011 | A1 | 5/2006 | Andry et al. |
| 2007/0025082 | A1 | 2/2007 | Lee et al. |
| 2007/0107875 | A1 | 5/2007 | Lee et al. |
| 2008/0096320 | A1 | 4/2008 | Farrar |
| 2009/0122491 | A1 | 5/2009 | Martin et al. |
| 2010/0116534 | A1 | 5/2010 | Choi et al. |
| 2010/0230805 | A1 | 9/2010 | Refai-Ahmed |
| 2010/0300202 | A1 | 12/2010 | Joyce |
| 2011/0129986 | A1 | 6/2011 | Libralesso et al. |
| 2013/0044431 | A1 | 2/2013 | Koeneman |
| 2013/0050944 | A1 | 2/2013 | Shepard |
| 2013/0087904 | A1 | 4/2013 | Clark et al. |
| 2014/0126150 | A1 | 5/2014 | Song et al. |
| 2015/0194363 | A1 | 7/2015 | Jun et al. |
| 2016/0276314 | A1 | 9/2016 | Ching et al. |
| 2017/0012016 | A1 | 1/2017 | Joshi et al. |
| 2017/0092565 | A1 | 3/2017 | Chen et al. |
| 2017/0103937 | A1 | 4/2017 | Hsieh et al. |
| 2018/0053730 | A1 | 2/2018 | Shao et al. |
| 2018/0087842 | A1 | 3/2018 | Chainer et al. |
| 2018/0090427 | A1 | 3/2018 | Bernstein et al. |
| 2018/0160565 | A1 | 6/2018 | Parida |
| 2018/0211900 | A1 | 7/2018 | Gutala et al. |
| 2018/0308783 | A1 | 10/2018 | Refai-Ahmed et al. |
| 2019/0008071 | A1 | 1/2019 | Kim |
| 2019/0355706 | A1 | 11/2019 | Enquist et al. |
| 2019/0385928 | A1 | 12/2019 | Leobandung |
| 2020/0035583 | A1 | 1/2020 | Beauchemin et al. |
| 2020/0105639 | A1 | 4/2020 | Valavala et al. |
| 2020/0312742 | A1 | 10/2020 | Lofgreen et al. |
| 2020/0343160 | A1 | 10/2020 | Mizerak et al. |
| 2020/0350233 | A1 | 11/2020 | Mizerak et al. |
| 2020/0352053 | A1 | 11/2020 | Mizerak et al. |
| 2020/0395313 | A1 | 12/2020 | Mallik et al. |
| 2021/0066164 | A1 | 3/2021 | Wu et al. |
| 2021/0175143 | A1 | 6/2021 | Yu et al. |
| 2021/0183741 | A1 | 6/2021 | Jha et al. |
| 2021/0193548 | A1 | 6/2021 | Wan et al. |
| 2021/0193620 | A1 | 6/2021 | Refai-Ahmed et al. |
| 2021/0280497 | A1 | 9/2021 | Brun et al. |
| 2021/0288037 | A1 | 9/2021 | Tao et al. |
| 2021/0378106 | A1 | 12/2021 | Iyengar et al. |
| 2021/0378139 | A1 | 12/2021 | Rice et al. |
| 2021/0410329 | A1 | 12/2021 | Yang et al. |
| 2022/0037231 | A1 | 2/2022 | Hsiao et al. |
| 2022/0087059 | A1 | 3/2022 | Sathyamurthy et al. |
| 2022/0117115 | A1 | 4/2022 | Malouin et al. |
| 2022/0130734 | A1 | 4/2022 | Chiu et al. |
| 2022/0189850 | A1 | 6/2022 | Liff et al. |
| 2022/0210949 | A1 | 6/2022 | Edmunds et al. |
| 2022/0230937 | A1 | 7/2022 | Malouin et al. |
| 2022/0408592 | A1 | 12/2022 | Malouin et al. |
| 2023/0048500 | A1 | 2/2023 | Malouin et al. |
| 2023/0154828 | A1 | 5/2023 | Haba et al. |
| 2023/0156959 | A1 | 5/2023 | Malouin et al. |
| 2023/0207474 | A1 | 6/2023 | Uzoh et al. |
| 2023/0245950 | A1 | 8/2023 | Haba et al. |
| 2023/0284421 | A1 | 9/2023 | Malouin et al. |
| 2023/0298969 | A1 | 9/2023 | Park et al. |
| 2024/0038633 | A1 | 2/2024 | Haba et al. |
| 2024/0203823 | A1 | 6/2024 | Uzoh et al. |
| 2024/0222222 | A1 | 7/2024 | Haba et al. |
| 2024/0222226 | A1 | 7/2024 | Haba |
| 2024/0249995 | A1* | 7/2024 | Haba .................... H01L 23/473 |
| 2024/0249998 | A1 | 7/2024 | Gao et al. |
| 2024/0266255 | A1 | 8/2024 | Haba et al. |

FOREIGN PATENT DOCUMENTS

| | | |
|---|---|---|
| CN | 115719735 A | 2/2023 |
| JP | 2000-340727 A | 12/2000 |
| KR | 10-1049508 B1 | 7/2011 |
| KR | 10-2023-0136509 A | 9/2023 |
| TW | 200834871 A | 8/2008 |
| WO | 2013/097146 A1 | 7/2013 |

OTHER PUBLICATIONS

Francisco Pires, "TSMC Exploring On-Chip, Semiconductor-Integrated Watercooling", tom's Hardware, retrieved from https://www.tomshardware.com/news/tsmc-exploring-on-chip-semiconductor-integrated-watercooling, Jul. 13, 2021, 23 pages.

(56) References Cited

OTHER PUBLICATIONS

IBM, "Functional electronic packaging-Thermal management roadmap", available online at <https://web.archive.org/web/20170220095511/https://www.zurich.ibm.com/st/electronicpackaging/cooling.html>, Feb. 20, 2017, 7 pages.
International Search Report and Written Opinion received for PCT Patent Application No. PCT/US23/28942, mailed on Nov. 16, 2023, 12 pages.
International Search Report and Written Opinion received for PCT Patent Application No. PCT/US23/84874, mailed on Apr. 22, 2024, 7 pages.
International Search Report and Written Opinion received for PCT Patent Application No. PCT/US23/85801, mailed on Apr. 26, 2024, 8 pages.
International Search Report and Written Opinion received for PCT Patent Application No. PCT/US23/85816, mailed on Apr. 23, 2024, 11 pages.
International Search Report and Written Opinion received for PCT Patent Application No. PCT/US23/86233, mailed on Apr. 26, 2024, 7 pages.
Kaplan, F. et al, "LoCool: Fighting Hot Spots Locally for System Energy Efficiency" IEEE Transactions on Computer-Aided Design of Intergrated Circuits and Systems, 39(4):895-908 (2020).
U.S. Appl. No. 18/129,567, filed Mar. 31, 2023, First Name Inventor: Cyprian Emeka Uzoh, "Embedded Cooling Systems for Device Packages and Methods of Cooling Packaged Devices".
PCT Application No. PCT/US2024/022253, International Search Report and Written Opinion dated Jul. 17, 2024, 14 pages.
Shamsa, M., et al., "Thermal conductivity of diamond-like carbon films", Applied Physics Letters, vol. 89, No. 16, Oct. 20, 2006, pp. 161921-161921-3.
Wu, C. J., et al., "Ultra High Power Cooling Solution for 3D-Ics", 2021 Symposium on VLSI Technology, Jun. 2021, 2 pages.
"KoolMicro Inc. developed the World's First 2,000 W/cm2 Cooling Technology for High Heat Generation Chips," Press Release, 2 pages, downloaded from www.semiconductorpackagingnews.com/uploads/1/KoolMicro_High_Cooling_Power_Density.pdf on Nov. 22, 2023.
"Single-Phase Direct-to-Chip Liquid Cooling," 6 pages, downloaded from https://jetcool.com/post/single-phase-direct-to-chip-liquid-cooling-microconvective-vs-microchannel-liquid-cooled-cold-plates/ on Mar. 7, 2024.
"Microconvective Liquid Cooling for high power electronics," https://jetcool.com/technology/, downloaded Mar. 7, 2024, 6 pages.
Benson D.A. et al., "Micro-Machined Heat Pipes in Silicon MCM Substrates", Sandia National Laboratories, Sandia Report: SAND97-0100-UC-704, printed Jan. 1997, 17 pages.
International Search Report and Written Opinion mailed Jun. 5, 2024, in International Application No. PCT/US2024/013758, 9 pages.
International Search Report and Written Opinion mailed Mar. 16, 2023, in International Application No. PCT/US2022/050105, 9 pages.
International Search Report and Written Opinion mailed May 30, 2023, in International Application No. PCT/US2023/061494, 9 pages.
Johnstone, Caitlin, "Coolant-on-Chip: Say Goodbye to Thermal Interfaces," jetcool, Jun. 9, 2020, https://jetcool.com/post/coolant-on-chip-say-goodbye-to-thermal-interfaces/, downloaded Feb. 29, 2024, 7 pages.
Lien, M. B., et al., "Ranging and light field imaging with transparent photodetectors", nature photonics, vol. 14, 2020, pp. 143-148.
Walsh, Stephen Michael, "Microjet Impingement Cooling of High Power-Density Electronics," Thesis, submitted May 11, 2018, 93 pages.

* cited by examiner

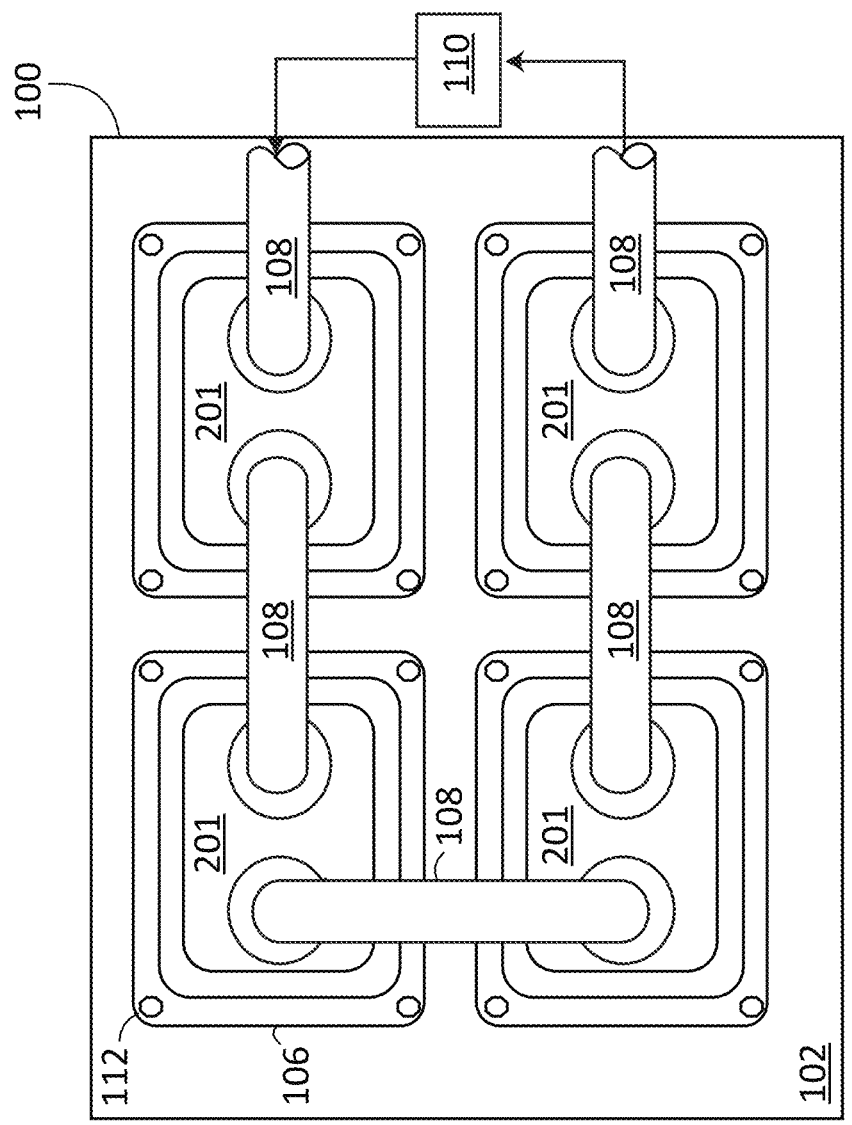
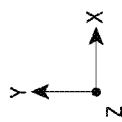
FIG. 2A

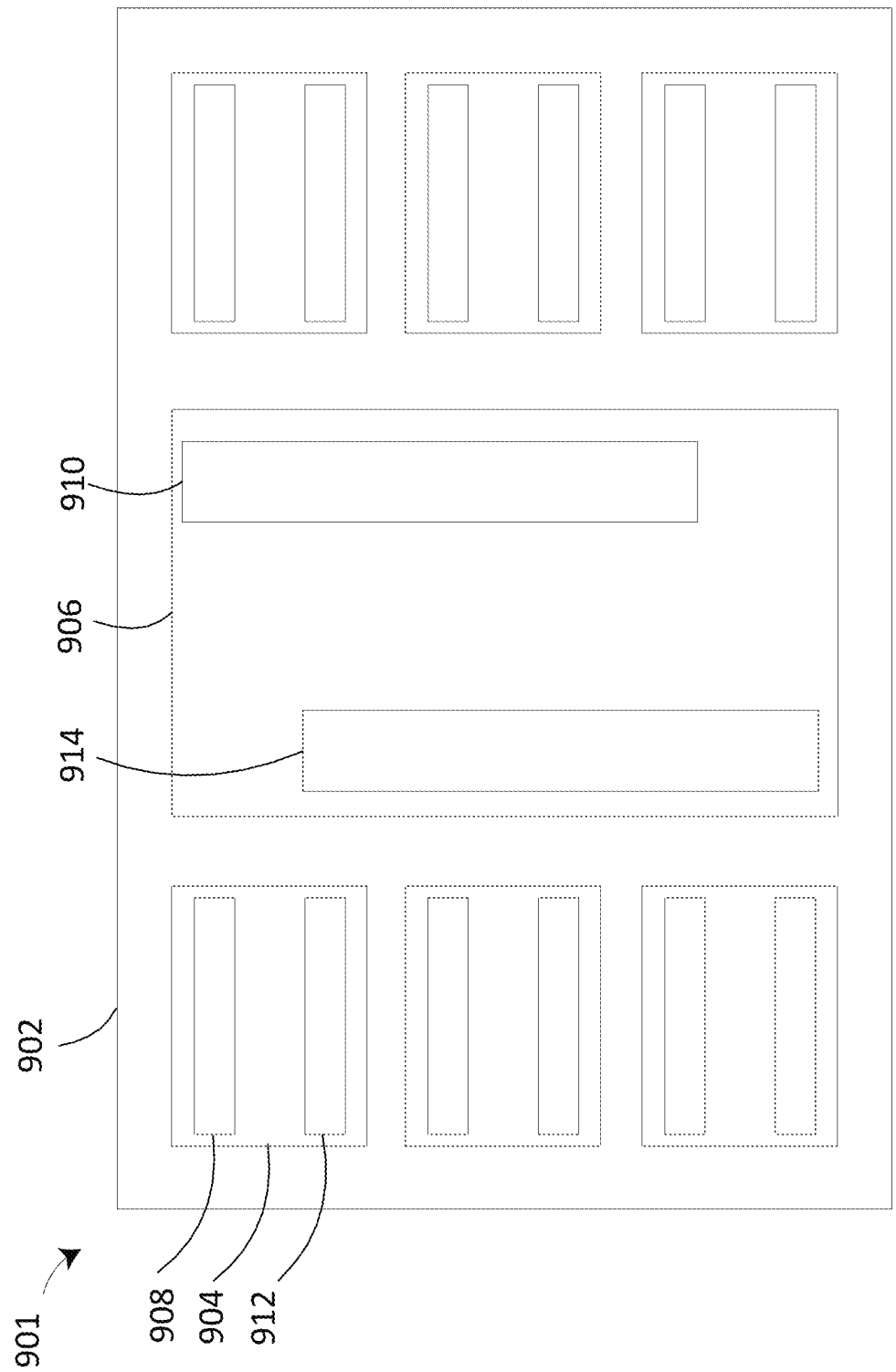

MANIFOLD DESIGNS FOR EMBEDDED LIQUID COOLING IN A PACKAGE

PRIORITY

It is contemplated that the device packages, cooling apparatuses, integrated cooling assemblies, and parts thereof described herein may incorporate one or more features of any one of the structures, apparatuses, assemblies, packages, etc., or may be formed by any one or a combination of the methods set forth in U.S. Provisional Patent Application No. 63/571,796, filed Mar. 29, 2024, which is incorporated by reference herein in its entirety.

BACKGROUND

The present disclosure relates to advanced packaging for microelectronic devices, and in particular, embedded cooling systems for device packages and methods of manufacturing the same.

SUMMARY

Energy consumption poses a critical challenge for the future of large-scale computing as the world's computing energy requirements are rising at a rate that most would consider unsustainable. Some models predict that the information, communication and technology (ICT) ecosystem could exceed 20% of global electricity use by 2030, with direct electrical consumption by large-scale computing centers accounting for more than one-third of that energy usage. A significant portion of the energy used by such large-scale computing centers is devoted to cooling since even small increases in operating temperatures can negatively impact the performance of microprocessors, memory devices, and other electronic components. While some of this energy is expended to operate the cooling systems that are directly cooling the chips (e.g., heat spreaders, heat pipes, etc.), energy consumption/costs for indirect cooling can also be quite staggering. Indirect cooling energy costs include, for example, cooling or air conditioning of data center buildings. Data center buildings can house thousands, to tens of thousands or more, of high-performance chips in server racks and each of those high-performance chips is a heat source. An uncontrolled ambient temperature in a data center will adversely affect the performance of the individual chips and the data center system performance as a whole.

Thermal dissipation in high-power density chips (semiconductor devices/dies/chiplets) is also a critical challenge as improvements in chip performance (e.g., through increased gate or transistor density due to advanced processing nodes, evolution of multi-core microprocessors, etc.) have resulted in increased power density and a corresponding increase in thermal flux that contributes to elevated chip temperatures. Higher density of transistors also increases the length of metal wiring on the chips, which generates its own additional thermal flux due to Joule heating of these wires due to higher currents. These elevated temperatures are undesirable as they can degrade the chip's operating performance, efficiency, reliability, and remaining life. Cooling systems used to maintain the chip at a desired operating temperature typically remove heat using one or more heat dissipation devices (e.g., thermal spreaders, heat pipes, cold plates, liquid cooled heat pipe systems, thermalelectric coolers, heat sinks, etc.). One or more thermal interface material(s) (e.g., thermal paste, thermal adhesive, and/or thermal gap filler), may be used to facilitate heat transfer between the surfaces of a chip and heat dissipation device(s). A thermal interface material(s) (TIM(s)) is any material that is inserted between two components to enhance the thermal coupling therebetween. Unfortunately, the combined thermal resistance of (i) the thermal resistance of interfacial boundary regions between a TIM(s) and the chip and/or the heat dissipation device(s); and (ii) the thermal resistance of a thermal interface material(s) itself can inhibit heat transfer from the chip to the heat dissipation devices, undesirably reducing the cooling efficiency of the cooling system.

Generally speaking, there are multiple components between the heat dissipating sources (i.e., active circuitry) in the chips and the heat dissipation devices, each of which contribute to the system thermal resistance accumulatively along the heat transfer paths and raise chip junction temperatures from the ambient. Such cooling systems can suffer from reduced cooling efficiency due to the design and manufacture of system components.

Many of these problems are exacerbated when device packages have more than one chip. In some cases, more chips result in an increase in the production of heat. To combat the increase in heat production, some device packages are designed to have more than one cold plate. For example, a device package with three chips may have three cold plates so that each chip is connected to a different cold plate. These device packages can result in increased heat dissipation, but the multi-chip, multi-cold-plate designs result in additional challenges. For example, some cooling systems are not set up with multiple inlet/outlets to allow coolant to flow to each of the different cold plates of the device package.

Accordingly, there exists a need in the art for improved energy-efficient cooling systems that support multi-chip and multi-cold-plate device packages, and methods of manufacturing the same.

BRIEF DESCRIPTION OF THE DRAWINGS

The above and other objects and advantages of the disclosure will be apparent upon consideration of the following detailed description, taken in conjunction with the accompanying drawings, in which:

FIG. 2A is a schematic plan view of an example of a system panel, in accordance with some embodiments of the disclosure;

FIG. 9 is a schematic top view of an example of a portion of a device package that may be used with the system panel, in accordance with some embodiments of the present disclosure;

Figure 1:
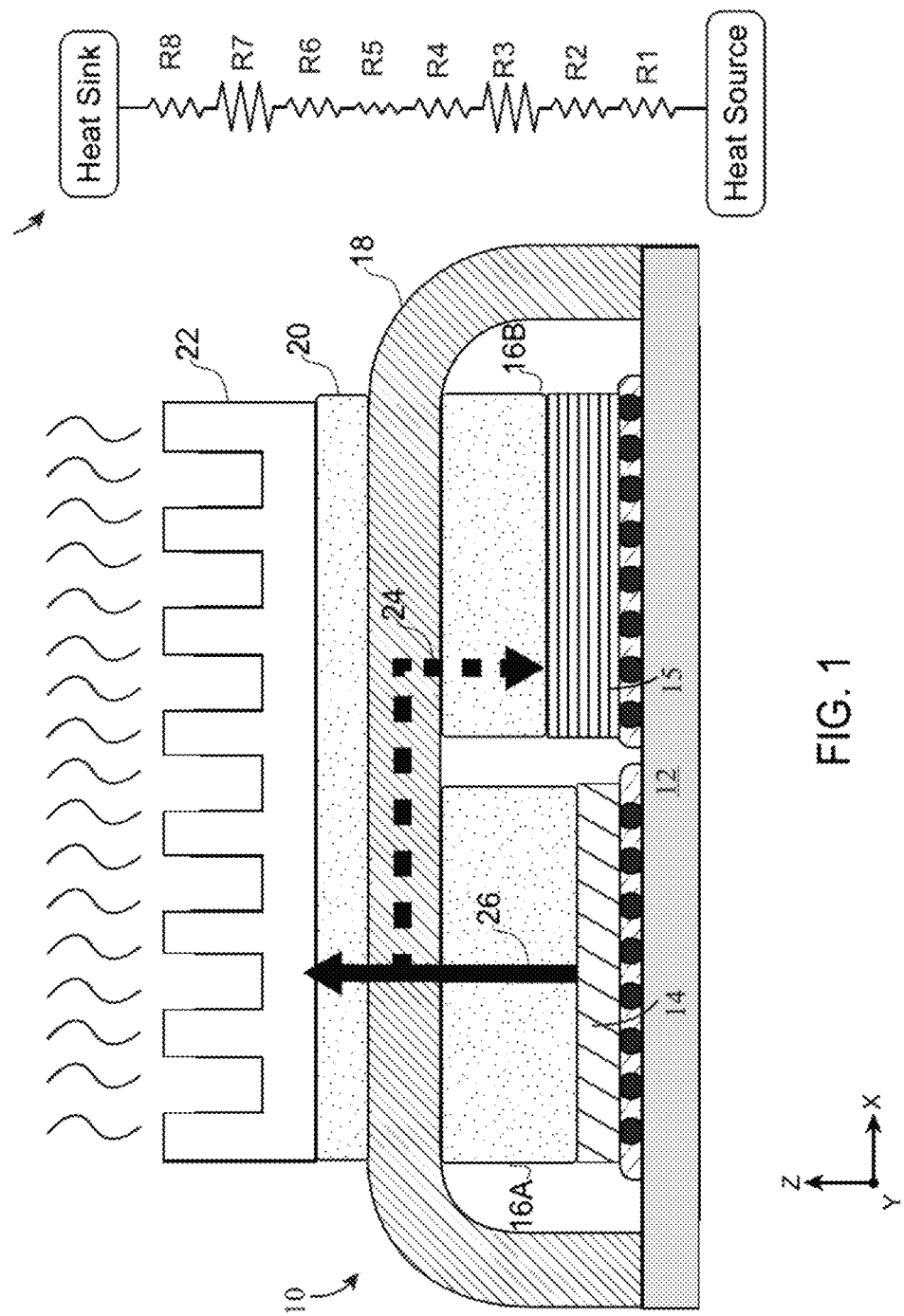
FIG. 1 illustrates a device package with an external heat sink, in accordance with some embodiments of the disclosure.

The figures herein depict various embodiments of the for purposes of illustration only. It will be appreciated that additional or alternative structures, assemblies, systems, and methods may be implemented within the principles set out by the present disclosure.

DETAILED DESCRIPTION

As used herein, the term "substrate" means and includes any workpiece, wafer, or article that provides a base material or supporting surface from which or upon which components, elements, devices, assemblies, modules, systems, or features of the heat-generating devices, packaging components, and cooling assembly components described herein may be formed or mounted. The term substrate also includes "semiconductor substrates" that provide a supporting material upon which elements of a semiconductor device are fabricated or attached, and any material layers, features, and/or electronic devices formed thereon, therein, or therethrough. Examples of substrate material that may be used in applications that generate high thermal density include, but are not limited to, Si, GaN, SiC, InP, GaP, InGaN, AlGaInP, AlGaAs, etc.

As described below, the semiconductor substrates herein generally have a "device side," (e.g., the side on which semiconductor device elements are fabricated, such as transistors, resistors, and capacitors) and a "backside" that is opposite the device side. The term "active side" should be understood to include a surface of the device side of the substrate and may include the device side surface of the semiconductor substrate and/or a surface of any material layer, device element, or feature formed thereon or extending outwardly therefrom, and/or any openings formed therein. Thus, it should be understood that the material(s) that form the active side may change depending on the stage of device fabrication and assembly. Similarly, the term "non-active side" (opposite the active side) includes the non-active side of the substrate at any stage of device fabrication, including the surfaces of any material layer, any feature formed thereon, or extending outwardly therefrom, and/or any openings formed therein. Thus, the terms "active side" or "non-active side" may include the respective surfaces of the semiconductor substrate at the beginning of device fabrication and any surfaces formed during material removal, (e.g., after substrate thinning operations). Depending on the stage of device fabrication or assembly, the terms "active sides" and "non-active sides" are also used to describe surfaces of material layers or features formed on, in, or through the semiconductor substrate, whether or not the material layers or features are ultimately present in the fabricated or assembled device. For example, in some instances, the term "active side" is used to indicate a surface of a substrate that will in the future, but does not yet, include semiconductor device elements.

Spatially relative terms are used herein to describe the relationships between elements, such as the relationships between substrates, heat-generating devices, cooling assembly components, device packaging components, and other features described below. Unless the relationship is otherwise defined, terms such as "above," "over," "upper," "upwardly," "outwardly," "on," "below," "under," "beneath," "lower," "top," "bottom" and the like are generally made with reference to the X, Y, and Z directions set forth by X, Y and Z axis in the drawings. Thus, it should be understood that the spatially relative terms used herein are intended to encompass different orientations of the substrate and, unless otherwise noted, are not limited by the direction of gravity. Unless the relationship is otherwise defined, terms describing the relationships between elements such as "disposed on," "embedded in," "coupled to," "connected by," "attached to," "bonded to," either alone or in combination with a spatially relevant term include both relationships with intervening elements and direct relationships where there are no intervening elements. Furthermore, the term "horizontal" is generally made with reference to the X-axis direction and the Y-axis direction set forth in the drawings. The term "vertical" is generally made with reference to the Z-axis direction set forth in the drawings.

Various embodiments disclosed herein include bonded structures in which two or more elements are directly bonded to one another without an intervening adhesive (referred to herein as "direct bonding", or "directly bonded"). In some embodiments, direct bonding includes the bonding of a single material on the first of the two or more elements and a single material on a second one of the two or more elements, where the single material on the different elements may or may not be the same. For example, bonding a layer of one inorganic dielectric (e.g., silicon oxide) to another layer of the same or different inorganic dielectric. As discussed in more detail below, the process of direct bonding provides a reduction of thermal resistance between a semiconductor device and a cold plate. Examples of dielectric materials used in direct bonding include oxides, nitrides, oxynitrides, carbonitrides, and oxycarbonitrides, etc., such as, for example, silicon oxide, silicon nitride, silicon oxynitride, silicon carbonitride, silicon oxycarbonitride, etc. Direct bonding can also include bonding of multiple materials on one element to multiple materials on the other element (e.g., hybrid bonding). As used herein, the term "hybrid bonding" refers to a species of direct bonding having both i) at least one ($1^{st}$) nonconductive feature directly bonded to another ($2^{nd}$) nonconductive feature, and ii) at least one ($1^{st}$) conductive feature directly bonded to another ($2^{nd}$) conductive feature, without any intervening adhesive. In some hybrid bonding embodiments, there are many $1^{st}$ conductive features, each directly bonded to a $2^{nd}$ conductive feature, without any intervening adhesive. In some embodiments, nonconductive features on the first element are directly bond to nonconductive features of the second element at room temperature without any intervening adhesive, which is followed by bonding of conductive features of the first element directly bonded to conductive features of the second element at via annealing at slightly higher temperatures (e.g., >100° C., >200° C., >250° C., >300° C., etc.)

Unless otherwise noted, the terms "cooling assembly" and "integrated cooling assembly" generally refer to a semiconductor device and a cold plate attached to the semiconductor device. Typically, the cold plate is formed with recessed surfaces that define one or more fluid cavities (e.g., coolant chamber volume(s) or coolant channel(s)) between the cold plate and the semiconductor device. In embodiments where the cold plate is formed with plural fluid cavities, each fluid cavity may be defined by cavity dividers and/or sidewalls of the cold plate. For example, cavity dividers may be spaced apart from each other and extend laterally between opposing cold plate sidewalls (e.g., in one direction between a first pair of opposing cold plate sidewalls, or in two directions between orthogonal pairs of opposing cold plate sidewalls). The cavity dividers and the cold plate sidewalls may collectively define adjacent fluid cavities therebetween. The cold plate may comprise a polymer material. The cold plate may be attached to the semiconductor device by use of a compliant adhesive layer or by direct bonding or hybrid bonding. For example, the cold plate may include material layers and/or metal features which facilitate direct bonding or hybrid bonding with the semiconductor device. Beneficially, the backside of the semiconductor device is directly exposed to coolant fluids flowing through the integrated cooling assembly, thus providing for direct heat transfer therebetween. Unless otherwise noted, the integrated cooling assemblies described herein may be used with any desired fluid (e.g., liquid, gas, and/or vapor-phase coolants, such as water, glycol etc.). In some embodiments, the coolant fluid(s) may contain additives to enhance the conductivity of the coolant fluid(s) within the integrated cooling assemblies. The additives may comprise, for example, nanoparticles of carbon nanotubes, nanoparticles of graphene, and/or nanoparticles of metal oxides. The concentration of these nanoparticles may be less than 1%, less than 0.2%, or less than 0.05%. The coolant fluids may also contain small amount of glycol or glycols (e.g., propylene glycol, ethylene glycol, etc.) to reduce frictional shear stress and drag coefficient in the coolant fluid(s) within the integrated cooling assembly.

This disclosure describes embodiments involving the architecture of system and component elements that can be employed to provide for the cooling of semi-conductor components, packaging, and boards. However, those skilled in the art will appreciate the disclosed components and arrangements can be deployed and used in scenarios where component heat up or thermal warm up is desired for a component that is currently outside the low end of the desired operational range. Components that are outside the low end of their operational range can, if started in a cold environment, experience thermal warping or cracking up to and including thermal overexpansion and contact separation that may impair the successful operation of the system. Therefore, in these scenarios, the architectures and embodiments disclosed herein can be used where the indirect thermal solutions supporting them are repurposed or operated in a hybrid configuration to provide warming fluids or heat transfer media to accomplish the warm-up or heat-up scenario. These scenarios are controlled by systems not shown here to bring temperatures up at a speed or timing that enables the materials to avoid the excessive thermal expansion or unequal thermal expansion that may occur among the materials of the semiconductor or packaging being serviced by the thermal solution. Once the component or packaging is brought up into the normal operating range, it can be safely started and brought to a useful operational state.

Considering the warm-up or heat-up embodiments introduced above, the balance of this disclosure and terms used should be viewed in a light that also considers the design option for such warm-up or heat-up. Thus, where terms such as cooling channel, cooling chamber volume, and cooling port are used, for example, such terms could also be considered as a thermal control channel, a thermal control volume, or a thermal control port, respectively. A person of skill would understand that heat flux or heat transfer would go in a different direction, but the design concepts are similar and can be successfully employed in the various embodiments.

In some embodiments, a cooling channel is a liquid cooling channel, and a liquid may flow through the liquid cooling channel. In some embodiments, the liquid may comprise a water and/or glycol (e.g., propylene glycol, ethylene glycol, and mixtures thereof).

As described below, coolant fluid flowing through a cold plate may be used to control the temperature of semiconductor devices. The fluid flowing across the surface of the semiconductor device absorbs heat and conducts heat away from the semiconductor device.

FIG. 1 is a schematic side view of a device package 10 and a heat sink 22 attached to the device package 10. The device package 10 typically includes a package substrate 12, a first device 14, a device stack 15, a heat spreader 18, and first TIM layers 16A, 16B thermally coupling the first device 14 and device stack 15 to the heat spreader 18. The device package 10 is thermally coupled to a heat sink 22 through a second TIM layer 20. The TIM layers 16A, 16B, 20 facilitate thermal contact between components in the device package 10 and between the device package 10 and the heat sink 22.

Unfortunately, as heat flux density increases with increasing power density in advanced semiconductor devices, the cumulative thermal resistance of the system illustrated in FIG. 1 is increasingly problematic as heat cannot be dissipated quickly enough to allow semiconductor devices to run at optimal power. Consequently, the energy efficiency of semiconductor devices is reduced. Furthermore, heat is transferred between semiconductor devices within the device package 10, as shown with heat transfer path 24 (illustrated as a dashed line), where heat may be undesirable transferred from the first device 14 having a high heat flux, such as a CPU or GPU, to the device stack 15 having low heat flux, such as memory, through the heat spreader 18.

For example, as shown in FIG. 1, each device package component and the respective interfacial boundaries therebetween has a corresponding thermal resistance which forms heat transfer path 26 (illustrated by arrow 26 in FIG. 1). The left-hand side of FIG. 1 illustrates the heat transfer path 26 as a series of thermal resistances R1-R8 between a heat source and a heat sink. Here, R1 is the thermal resistance of the bulk semiconductor material of the first device 14. R3 and R7 are the thermal resistances of the first TIM layers 16A, 16B and the second TIM layer 20, respectively. R5 is the thermal resistance of the heat spreader 18. R2, R4, R6, and R8 represent the thermal resistance at the interfacial region of the components (e.g., contact resistances). In a typical cooling system, R3 and R7 may account for 80% or more of the cumulative thermal resistance of the heat transfer path 26 and R5 may account for 5% or more. R1 of the first device 14 and R2, R4, R6, and R8 of the interfaces account for the remaining cumulative thermal resistance. Accordingly, embodiments herein provide for integrated cooling assemblies embedded within a device package. The embedded cooling assemblies shorten the thermal resistance path between a semiconductor device and a heat sink and reduce thermal communication between semiconductor devices disposed in the same device package, such as described in relation to the figures below.

FIG. 2A is a schematic plan view of an example of a system panel 100, in accordance with some embodiments of the disclosure. Generally, the system panel 100 includes a printed circuit board, here PCB 102, a plurality of device packages 201 mounted to the PCB 102, and a plurality of coolant lines 108 fluidly coupling each of the device packages 201 to a coolant source 110. It is contemplated that coolant fluid may be delivered to each of the device packages 201 in any desired fluid phase (e.g., liquid, vapor, gas, or combinations thereof) and may flow out from each device package 201 in the same phase or a different phase. In some embodiments, the coolant fluid is delivered to the device packages 201 and returned therefrom as a liquid, whereby the coolant source 110 may comprise a heat exchanger or chiller to maintain the coolant fluid at a desired temperature. In other embodiments, the coolant fluid may be delivered to the device packages 201 as a liquid, vaporized to a vapor within the device packages 201, and returned to the coolant source 110 as a vapor. In those embodiments, the device packages 201 may be fluidly coupled to the coolant source 110 in parallel and the coolant source 110 may include or further include a compressor (not shown) for condensing the received vapor to a liquid form.

Figure 2B:
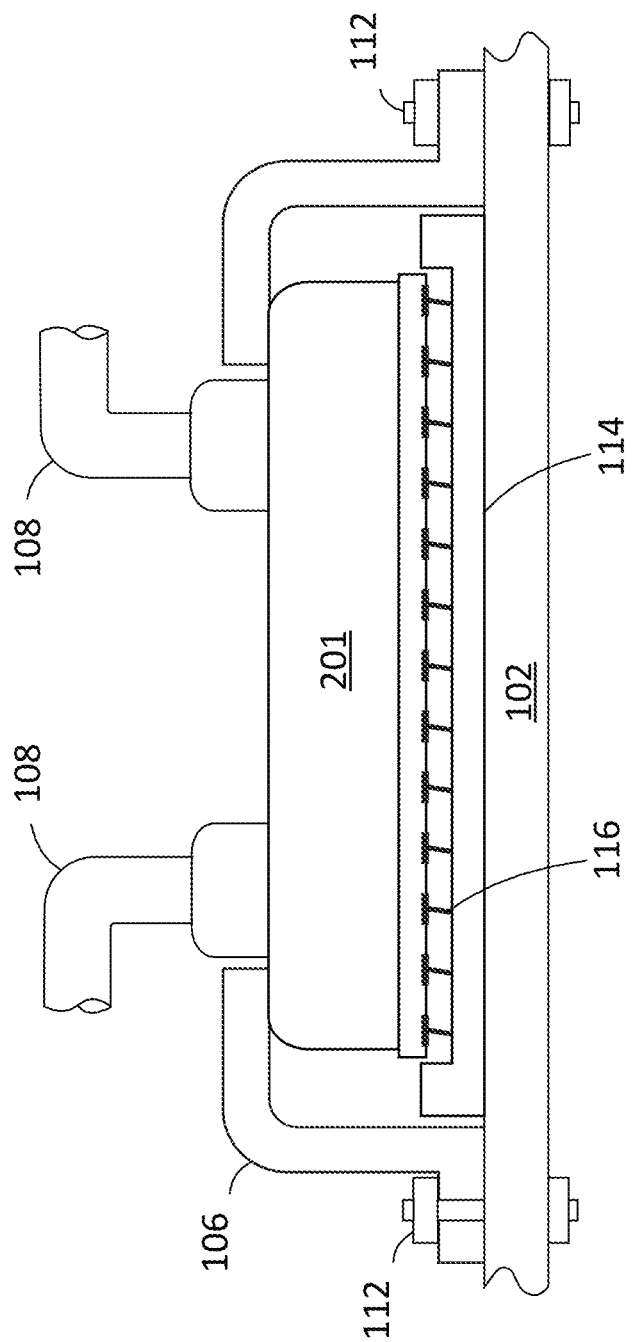
FIG. 2B is a schematic partial sectional side view of a device package mounted on a PCB, in accordance with some embodiments of the disclosure.

FIG. 2B is a schematic partial sectional side view of a portion of the system panel 100 of FIG. 2A, in accordance with some embodiments of the disclosure. As shown, each device package 201 is fluidly coupled to the plurality of coolant lines 108 and is disposed in a socket 114 of the PCB 102 and connected thereto using a plurality of pins 116, or by other suitable connection methods, such as solder bumps (not shown). The device package 201 may be seated in the socket 114 and secured to the PCB 102 using a mounting frame 106 and a plurality of fasteners 112, (e.g., compression screws, collectively configured to exert a relatively uniform downward force on the upward facing edges of the device package 201). The uniform downward force ensures proper pin contact between the device package 201 and the socket 114.

Figure 2C:
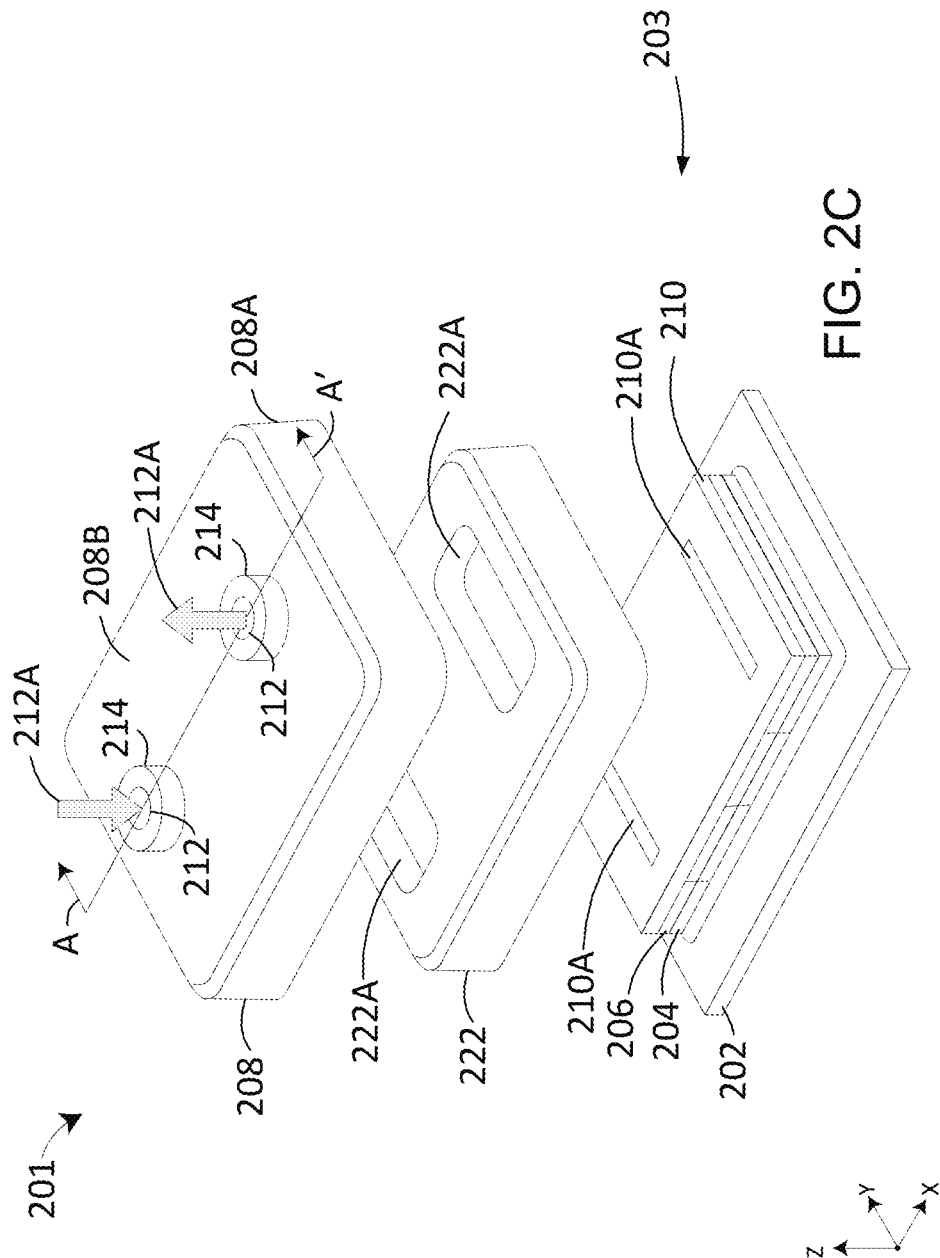
FIG. 2C is a schematic exploded isometric view of the device package in FIG. 2B, in accordance with some embodiments of the disclosure.

FIG. 2C is a schematic exploded isometric view of an example device package 201, in accordance with some embodiments of the disclosure. Generally, the device package 201 includes a package substrate 202, an integrated cooling assembly 203 disposed on the package substrate 202, and a package cover 208 disposed on a peripheral portion of the package substrate 202. Suitable materials that may be used in the package cover 208 include copper, aluminum, metal alloys, etc. The package cover 208 extends over the integrated cooling assembly 203 so that the integrated cooling assembly 203 is disposed between the package substrate 202 and the package cover 208. The integrated cooling assembly 203 typically includes one or more semiconductor devices (e.g., a first semiconductor device 204), one or more cold plates (e.g., a first cold plate 206) bonded to the one or more semiconductor devices, and a manifold 210 attached to the one or more cold plates. In some embodiments, one or more cold plates and one or more semiconductor device may be the same or similar to the first cold plate 206 and first semiconductor device 204.

In some embodiments, the first cold plate 206 may comprise substrate material like silicon, glass, ceramic, etc. Although the lateral dimensions (or footprint) of the first cold plate 206 is shown to be the same or similar to the lateral dimensions (or footprint) of the first semiconductor device 204, the footprint of the first cold plate 206 may be smaller or larger in one or both directions when compared to the footprint of the first semiconductor device 204.

As shown, the device package 201 further includes a sealing material layer 222 that forms a coolant fluid impermeable barrier between the package cover 208 to the integrated cooling assembly 203 that prevents the leaking of the coolant fluid outside of the cooling assembly and prevents coolant fluid from reaching an active side 218 (discussed below in relation to FIG. 3) of the first semiconductor device 204 and causing damage thereto. In some embodiments, the sealing material layer 222 comprises an adhesive material that reliably attaches the package cover 208 to the integrated cooling assembly 203. In some embodiments, the sealing material layer 222 comprises a polymer or epoxy material that extends upwardly from the package substrate 202 to encapsulate and/or surround at least a portion of the one or more semiconductor devices. In some embodiments, the sealing material layer 222 may also comprise conductive material (e.g., solder). In some embodiments, the sealing material layer 222 is formed from a molding compound (e.g., a thermoset resin), that when polymerized, forms a hermetic seal between the package cover 208 and the manifold 210. Here, coolant fluid is delivered to the first cold plate 206 through openings 222A disposed through the sealing material layer 222. As shown, the openings 222A are respectively in registration and fluid communication with inlet and outlet openings 212 of the package cover 208 thereabove and inlet and outlet openings 210B in the manifold 210 therebelow. In some embodiments, inlet and outlet openings 210B in the manifold 210 are in fluid communication with one or more inlets and outlet of the one or more cold plates.

Generally, the package substrate 202 includes a rigid material, such as an epoxy or resin-based laminate, that supports the integrated cooling assembly 203 and the package cover 208. The package substrate 202 may include conductive features disposed in or on the rigid material that electrically couple the integrated cooling assembly 203 to a system panel, such as the PCB 102.

Figure 3:
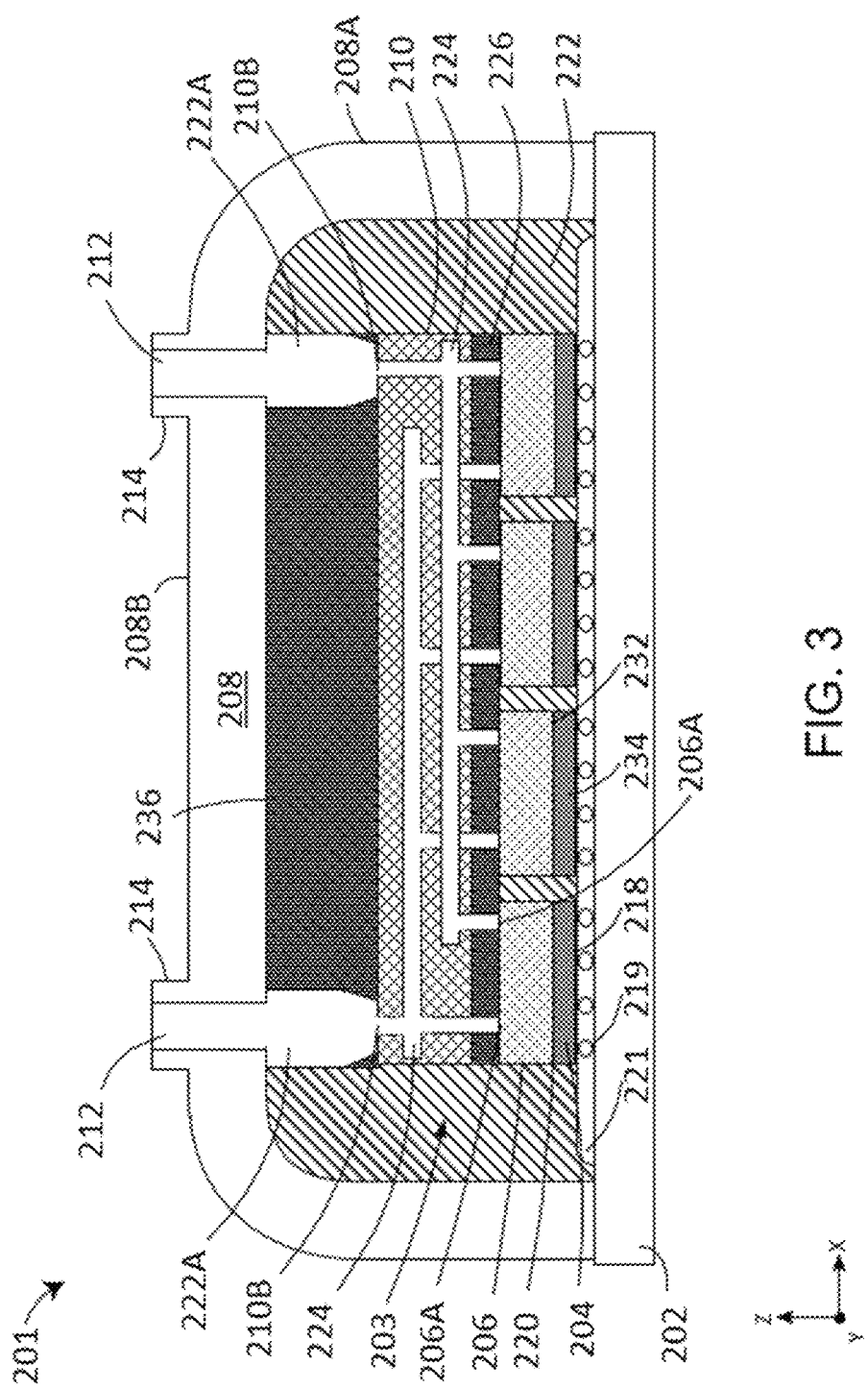
FIG. 3 is a schematic sectional view of an example device package that may be used with the system panel, in accordance with some embodiments of the present disclosure.

FIG. 3 is a schematic sectional view in the X-Z plane of the device package 201 taken along line A-A' of FIG. 2C, in accordance with some embodiments of the disclosure. As illustrated in FIG. 3, the first semiconductor device 204 includes the active side 218 that includes device components (e.g., transistors, resistors, and capacitors, formed thereon or therein), and a non-active side, here the first semiconductor device backside 220, opposite the active side 218. As shown, the active side 218 is positioned adjacent to and facing towards the package substrate 202. The active side 218 may be electrically connected to the package substrate 202 by use of conductive bumps 219, which are encapsulated by a first underfill layer 221 disposed between the first semiconductor device 204 and the package substrate 202. The first underfill layer 221 may comprise a cured polymer resin or epoxy, which provides mechanical support to the conductive bumps 219 and protects against thermal fatigue. In some embodiments, the active side 218 may be electrically connected to another package substrate, another active die, or another passive die (e.g., interposer) using hybrid bonding or conductive bumps 219. The first cold plate 206 may be disposed above the package substrate 202 with the first semiconductor device 204 disposed therebetween. For example, the first semiconductor device 204 (and the first underfill layer 221) may be disposed between the first cold plate 206 and the package substrate 202. In some embodiments, the first cold plate 206 may be disposed directly on the package substrate 202.

In some embodiments, the backside 220 of the first semiconductor device 204 comprises a corrosion protective layer (not shown). The corrosion protective layer may be a continuous layer disposed across the entire backside 220 of the first semiconductor device 204, such that the first cold plate 206 is attached thereto. Beneficially, the corrosion protective layer provides a corrosion resistant barrier layer, thus preventing undesired corrosion of the first semiconductor device 204 (e.g., the semiconductor substrate material which might otherwise be in direct contact with coolant fluid flowing through a coolant chamber volume).

In some embodiments, one or more cold plates (e.g., first cold plate 206) and/or one or more manifolds (e.g., manifold 210) comprise one or more coolant chamber volumes. In some embodiments, one or more coolant chamber volumes may include one or more coolant channels. For example, a first set of coolant channels 224 may extend between a first inlet opening and a first outlet opening of the manifold 210, such that the coolant chamber volume(s) and/or coolant channel(s) share the same inlet and outlet openings. In another example, a second set of coolant channels may extend between a first inlet opening and a first outlet opening of the first cold plate 206, such that the coolant chamber volume(s) and/or coolant channel(s) share the same inlet and outlet openings. In some embodiments, multiple inlet and/or outlet openings may be coupled to the coolant chamber volume(s).

In embodiments having plural coolant chamber volumes and/or plural coolant channels, each coolant chamber volume and/or coolant channel may be connected between a separate inlet opening and a separate outlet opening. In such embodiments, coolant fluid may be directed to the separate inlet openings and from the separate outlet openings using the manifold 210. For example, coolant may travel from the inlet openings 210B, through one or more coolant channels in the manifold 210 into a first inlet opening of the first cold plate 206 and a second inlet opening of the second cold plate 232. The coolant may then flow through one or more coolant channels in the first cold plate 206 and the second cold plate 232, then exit the first cold plate 206 via a first outlet opening of the first cold plate 206 and exit the second cold plate 232 via a second outlet opening of the second cold plate 232. The coolant may then flow through one or more coolant channels in the manifold 210 into an outlet opening 210B.

In some embodiments, a height in the Z-axis direction of the coolant chamber volume(s) and or coolant channel(s) may be greater than 100 μm, 100 μm-1000 μm, or 100 μm-700 μm. A width in the Y-axis direction of the coolant chamber volume(s) and/or coolant channel(s) may be greater than 100 μm, 100 μm-1000 μm, or 100 μm-700 μm. For example, the width of the coolant chamber volume(s) and/or coolant channel(s) may be greater than the height. A cross-section of the coolant chamber volume(s) and/or coolant channel(s) in the Y-Z plane is wide enough to allow for a pressure drop of 0-20 psi, 3-15 psi, 4-10 psi.

In some embodiments, preparing a desired surface roughness of the sidewalls of the coolant chamber volume(s) and/or coolant channels may include depositing an organic layer on a photoresist layer after cold plate features have been etched to form a micromasking layer, such as between 1 to 30 nm. The micromasking layer may be dry etched to form the desired surface roughness, such as between 0.1 to 3.0 nm.

Figure 4:
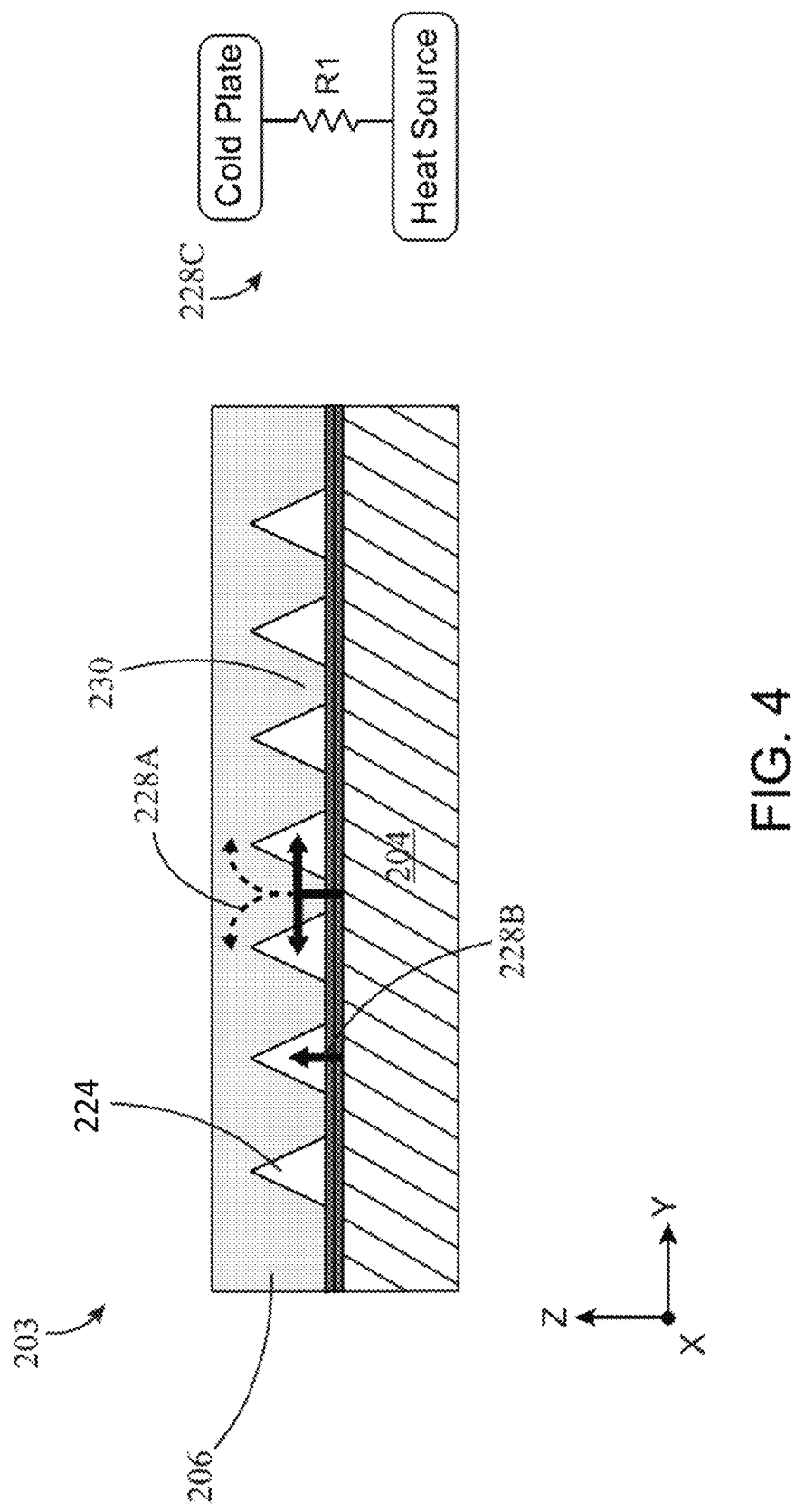
FIG. 4 is a schematic sectional view of an integrated cooling assembly of the device package, according to some embodiments of the disclosure.

With reference to FIG. 3, the first cold plate 206 is attached to the backside 220 of the first semiconductor device 204 without the use of an intervening adhesive (e.g., the first cold plate 206 may be directly bonded to the backside 220 of the first semiconductor device 204), such that the first cold plate 206 and the backside 220 of the first semiconductor device 204 are in direct contact. For example, in some embodiments, one or both of the first cold plate 206 and the backside 220 of the first semiconductor device 204 may comprise a dielectric material layer (e.g., a first dielectric material layer, a second dielectric material layer, etc.), and the first cold plate 206 is directly bonded to the backside 220 of the first semiconductor device 204 through bonds formed between the dielectric material layers. In some embodiments, one of the first cold plate 206 or the backside 220 of the first semiconductor device 204 may comprise a thin bonding dielectric layer (e.g., silicon nitride, etc.) and other element(s) may not include any such explicit bonding dielectric layer (or can have only native oxide layer). In some embodiments, the first and second dielectric material layers are continuous layers. In some embodiments, one or both of the layers may not be continuous. For example, the first dielectric material layer may be disposed only on lower surfaces of the first cold plate 206 facing the backside 220 of the first semiconductor device 204. With reference to FIG. 4, described below, portions of the first dielectric material layer may be disposed only on lower surfaces of support features. Beneficially, directly bonding the first cold plate 206 to the first semiconductor device 204, as described above, reduces the thermal resistance therebetween and increases the efficiency of heat transfer from the first semiconductor device 204 to the first cold plate 206.

In some embodiments, the two or more devices are reconstituted and then bonded to the one or more cold plates. One or more of the two or more devices may be singulated and/or disposed in a vertical device stack. Cold plates may be attached to one or more devices and/or one or more device stacks (e.g., by the direct bonding methods described herein or other method including flip chip bonding, etc.). In some embodiments, one or more devices may comprise a processor and one or more device stacks may comprise a plurality of memory devices. Here, the one or more devices are disposed in a side-by-side arrangement on the package substrate 202 and are in electrical communication with one another through conductive elements formed in, on, or through the package substrate 202. Here, each cold plate is sized to provide a bonding surface for attachment to the devices. In some embodiment, the lateral dimensions (or footprint) of the one or more cold plates (e.g., the first cold plate 206) may be smaller or larger than the combined lateral dimensions (or footprint) of one or more devices. In some embodiments, one or more sidewalls of the one or more cold plates may be aligned or offset to the vertical sidewalls of one or more devices (including inside or outside their footprint).

FIG. 4 is a schematic sectional view in the Y-Z plane of the integrated cooling assembly 203, in accordance with some embodiments of the disclosure. In FIG. 4, the first cold plate 206 comprises a patterned side that faces towards the first semiconductor device 204 and an opposite side that faces towards the package cover 208 (not shown). The patterned side comprises a coolant chamber volume having plural coolant channels 224, which extend laterally between the inlet and outlet openings of the first cold plate 206. Each coolant channel 224 comprises cavity sidewalls which define a corresponding coolant channel 224. Portions of the first cold plate 206 between the cavity sidewalls form support features. The support features provide structural support to the integrated cooling assembly 203 and disrupt laminar fluid flow at the interface of the coolant and the device backside 220, resulting in increased heat transfer therebetween. Furthermore, by introducing plural coolant channels 224 to define separate coolant flow paths, an internal surface area of the first cold plate 206 is increased, which further increases the efficiency of heat transfer.

In FIG. 4, arrows 228A and 228B illustrate two different heat transfer paths in the integrated cooling assembly 203. A first heat transfer path illustrated by arrow 228B shows heat generated by the first semiconductor device 204 transferring directly from the first semiconductor material of the first semiconductor device 204 to coolant fluid flowing through the first cold plate 206. A second heat transfer path illustrated by arrows 228A shows heat generated by the first semiconductor device 204 being transferred from semiconductor material (e.g., silicon material) of the first semiconductor device 204 to semiconductor material (e.g., silicon material) of the first cold plate 206 structure, propagated throughout the semiconductor material of the first cold plate 206 structure (shown as dashed lines), and being transferring into coolant fluid flowing through the first cold plate 206. A thermal resistance of the first and second heat transfer paths 228A, 228B is illustrated by heat transfer path 228C, which is shown as thermal resistance R1 between a heat source and a cold plate. Here, R1 is the thermal resistance of the bulk semiconductor material of the first semiconductor device 204. It can be seen that the heat transfer path 228C of the integrated cooling assembly 203 is reduced compared to the heat transfer path 26 of the device package 10 of FIG. 1, due to the direct bonding discussed above.

In some embodiments, the first cold plate 206 may be attached to the first semiconductor device 204 using a hybrid bonding technique, where bonds are formed between one or more dielectric material layers and between metal features, such as between first metal pads and second metal pads, disposed in the one or more dielectric material layers.

Suitable dielectrics that may be used as the one or more dielectric material layers include silicon oxides, silicon nitrides, silicon oxynitrides, silicon carbon nitrides, metal-oxides, metal-nitrides, silicon carbide, silicon oxycarbides, silicon oxycarbonitride, diamond-like carbon (DLC), or combinations thereof. In some embodiments, one or more of the dielectric material layers are formed of an inorganic dielectric material (e.g., a dielectric material substantially free of organic polymers). Typically, one or more of the dielectric layers are deposited to a thickness greater than the thickness of a native oxide, such as about 1 nanometer (nm) or more, 5 nm or more, 10 nm or more, 50 nm or more, or 100 nm or more. In some embodiments, one or more of the layers are deposited to a thickness of 3 micrometer or less, 1 micrometer or less, 500 nm or less, such as 100 nm or less, or 50 nm or less. The dielectric layer material and thickness may be optimized for lower thermal resistance between the die and the cold plate.

The first cold plate 206 may be formed of any suitable material that has sufficient structural strength to withstand the desired pressures of coolant flowing into one or more coolant chamber volume. For example, the first cold plate 206 may be formed of semiconductor material like silicon or other engineered materials like glass. In other examples, the first cold plate 206 may be formed of a material selected from a group comprising polymers, metals, ceramics, or composites thereof. In some embodiments, the first cold plate 206 may be formed of stainless steel (e.g., from a stainless-steel metal sheet) or a sapphire plate.

In some embodiments, the first cold plate 206 may be formed of a bulk material having a substantially similar coefficient of linear thermal expansion (CTE) to the bulk material of the substrate 202, where the CTE is a fractional change in length of the material (in the X-Y plane) per degree of temperature change. In some embodiments, the CTEs of the first cold plate 206 and the substrate 202 are matched so that the CTE of the substrate 202 is within about +/−20% or less of the CTE of the first cold plate 206, such as within +/−15% or less, within +/−10% or less, or within about +/−5% or less when measured across a desired temperature range. In some embodiments, the CTEs are matched across a temperature range from about −60° C. to about 100° C. or from about −60° C. to about 175° C. In one example embodiment, the matched CTE materials each include silicon.

In some embodiments, the first cold plate 206 may be formed of a material having a substantially different CTE from the first semiconductor device 204 (e.g., a CTE mismatched material). In such embodiments, the first cold plate 206 may be attached to the first semiconductor device 204 by a compliant adhesive layer (not shown) or a molding material that absorbs the difference in expansion between the first cold plate 206 and the first semiconductor device 204 across repeated thermal cycles.

In some embodiments, the device package 201 comprises a first TIM 226 between one or more cold plates (e.g., first cold plate 206) and the manifold 210. In some embodiments, the device package 201 also comprises a second TIM 236 between the manifold 210 and the package cover 208. Although the first TIM 226 and the second TIM 236 are show, the device package 201 may only comprise one of the first TIM 226 and the second TIM 236. In some embodiments, the device package 201 does not comprise both the first TIM 226 and the second TIM 236.

The package cover 208 generally comprises one or more vertical or sloped sidewall portions 208A and a lateral portion 208B that spans and connects the sidewall portions 208A. The sidewall portions 208A may extend upwardly from a peripheral surface of the package substrate 202 to surround one or more devices and the one or more cold plates disposed thereon. The lateral portion 208B may be disposed over the first cold plate 206 and is typically spaced apart from the first cold plate 206 by a gap corresponding to the thickness of the sealing material layer 222. Coolant is circulated through one or more coolant chamber volumes through the inlet and outlet openings 212 of the package cover 208 formed through the lateral portion 208B. The inlet and outlet openings 210B of the manifold may be in fluid communication with the inlet and outlet openings 212 of the package cover 208 through the inlet and outlet openings 222A formed in the sealing material layer 222 disposed therebetween. In certain embodiments, coolant lines 108 (FIGS. 2A-2B) may be attached to the device package 201 by use of connector features formed in the package cover 208, such as threads formed in the sidewalls of the inlet and outlet openings 212 of the package cover 208 and/or protruding features 214 that surround the inlet and outlet openings 212 and extend upwardly from a surface of the lateral portion 208B.

Typically, the package cover 208 is formed of semi-rigid or rigid material so that at least a portion of the downward force exerted on the package cover 208 by the mounting frame is transferred to a supporting surface of the package substrate 202 and not transferred to the one or more cold plates and one or more semiconductor devices therebelow. In some embodiments, the package cover 208 is formed of a thermally conductive metal, such as aluminum or copper. In such embodiments, the package cover 208 functions as a heat spreader that redistributes heat from one or more electronic components of the one or more semiconductor devices.

It should be noted that the direction in which coolant fluid flows through the manifold 210 and the one or more cold plates may be controlled depending on the relative locations of the inlet and outlet openings. For example, coolant fluid may flow from left to right in the device package 201 of FIG. 3 when the inlet openings 212, 222A, 210B, 206A of the package cover 208, the sealing material layer 222, the manifold 210, and the first cold plate 206 respectively, are located on the left-hand side of the device package 201 and the outlet openings 212, 222A, 210B, 206A of the package cover 208, the sealing material layer 222, the manifold 210, and the first cold plate 206, respectively, are located on the right-hand side of the device package 201. Alternatively, coolant fluid may flow from right to left in the device package 201 illustrated in FIG. 3 when the outlet openings 212, 222A, 210B, 206A of the package cover 208, the sealing material layer 222, the manifold 210, and the first cold plate 206, respectively, are located on the left-hand side of the device package 201 and the inlet openings 212, 222A, 210B, 206A of the package cover 208, the sealing material layer 222, the manifold 210, and the first cold plate 206, respectively are located on the right-hand side of the device package 201.

An example flow path of the coolant fluid may be as follows:

1. Coolant fluid enters the first set of coolant channels 224 of the manifold 210 through the inlet openings.

2. Coolant fluid flows from the manifold 210 to the one or more cold plates (e.g., the first cold plate 206)

3. Coolant fluid flows across the inside surfaces of the first cold plate 206 and absorbs heat generated by the first semiconductor device 204 which has dissipated into the first cold plate 206 structure. The coolant fluid may also flow directly across the backside 220 of the first semiconductor device 204 to absorb heat energy directly from the first semiconductor device 204. The first cold plate 206 may additionally have various channels formed to direct the coolant fluid flow from inlet opening(s) to outlet opening(s) and facilitate heat extraction from the first semiconductor device 204 by the coolant fluid. In some embodiments, the coolant fluid may be in direct contact with the backside 220 of the first semiconductor device 204 or via one or more substrate or layers between the coolant fluid or backside 220 of the first semiconductor device 204.

4. Coolant fluid flows from the first cold plate 206 into the first set of coolant channels 224 of the manifold 210.

5. Coolant fluid exits the manifold 210 through outlet openings.

It will be understood from the above flow path that heat is extracted without introducing an unnecessary thermal resistance (such as, for example, a TIM disposed between the backside 220 of the first semiconductor device 204 and the first cold plate 206) between the backside 220 of the first semiconductor device 204 and the first cold plate 206.

In some embodiments, the first set of coolant channels 224 allow for coolant to flow through one or more cold plates in parallel. For example, coolant may travel from the first inlet openings 210B, through one or more coolant channels in the manifold 210 into an inlet opening of the first cold plate 206 and an inlet opening of a second cold plate 232 coupled to a second semiconductor device 234. The coolant may then flow through one or more coolant channels in the cold plates (e.g., first cold plate 206 and second cold plate 232) and exit the cold plates via outlet openings of the respective cold plates. The coolant may then flow through one or more coolant channels in the manifold 210 into an outlet opening 210B.

In some embodiments, the manifold 210 is configured to couple with one or more cold plates, wherein the one or more cold plates extend to the same height. For example, the first cold plate 206 and the second cold plate 232 may both extend to a first vertical height and the manifold 210 may be configured to couple with the first cold plate 206 and the second cold plate 232. In some embodiments, the manifold 210 is configured to couple with one or more cold plates, wherein the one or more cold plates do not extend to the same height. For example, the first cold plate 206 may extend to a first vertical height and the second cold plate 232 may extend to a second vertical height. The first vertical height may be different than the second vertical height and the manifold 210 may be configured to couple with both the first cold plate 206 and the second cold plate 232 despite the difference in vertical height. For example, the manifold 210 may have one or more protrusions or recessions to facilitate coupling with the different vertical heights.

In some embodiments, one or more cold plates are configured according to the thicknesses of one or more semiconductor devices. For example, the first semiconductor device 204 may have a first thickness and the second semiconductor device 234 may have a second thickness. The first thickness may be different than the second thickness. In some embodiments, the first cold plate 206 is designed so that that a first combined thickness of the first cold plate 206 and the first semiconductor device 204 is the same or similar to a second combined thickness of the second cold plate 232 and the second semiconductor device 234. For example, if the first thickness of the first semiconductor device 204 is less than the thickness of the second semiconductor device 234 then the thickness of the first cold plate 206 may be greater than the thickness of the second cold plate 232.

In some embodiments, the vertical difference between thicknesses of the first semiconductor device 204 and the second semiconductor device 234 is the same or similar to the vertical difference between the thickness of the first cold plate 206 and the thickness of the second cold plate 232. For example, the first thickness of the first semiconductor device 204 may be 2 mm less the second thickness of the second semiconductor device 234. In such an example, the thickness of the first cold plate 206 may be 2 mm greater than the thickness of the second cold plate 232 so that the combined vertical height of the first semiconductor device 204 and the first cold plate 206 is the same or similar to the combined vertical height of the second semiconductor device 234 and the second cold plate 232.

Figure 5:
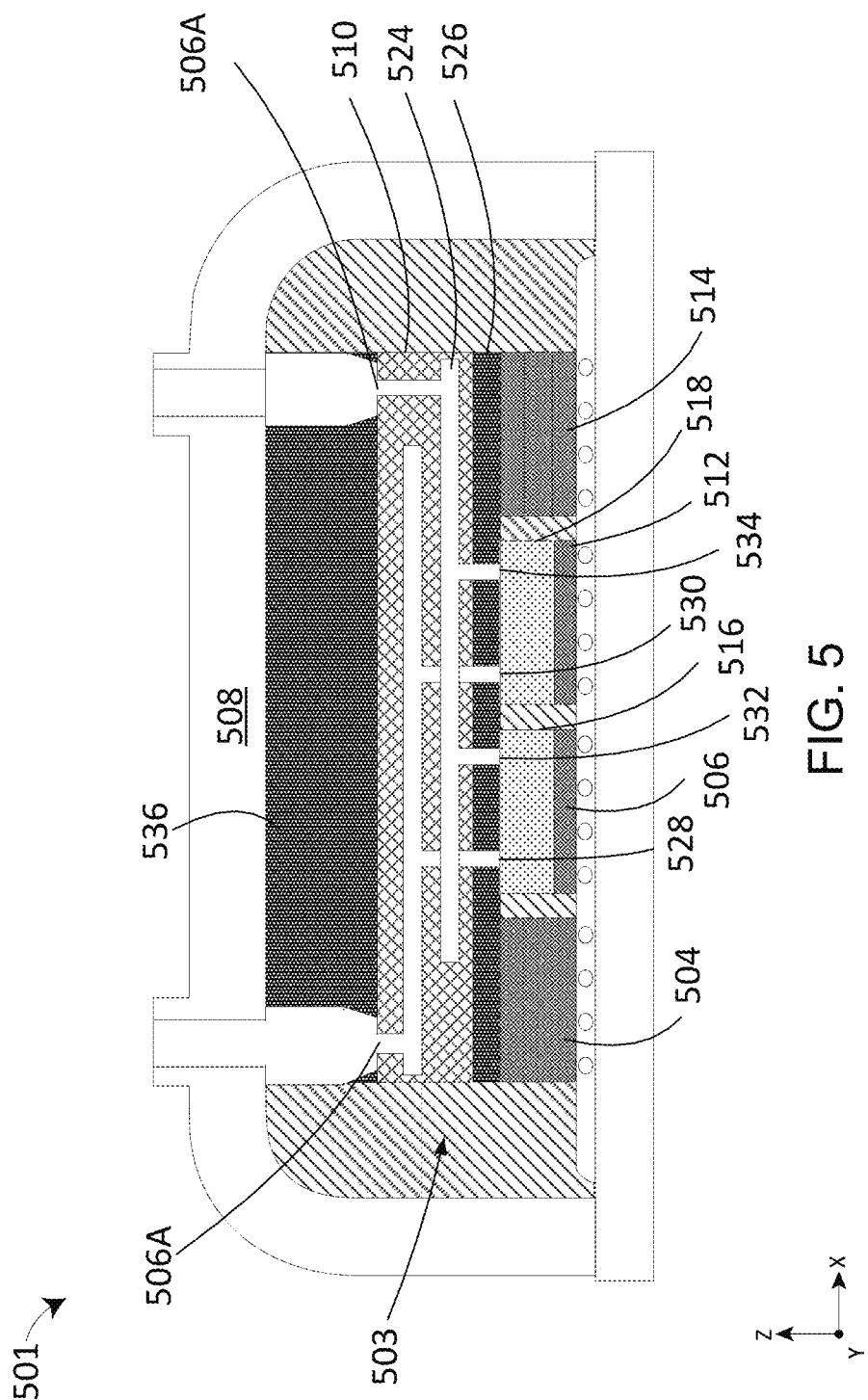
FIG. 5 is a schematic sectional view of another example device package that may be used with the system panel, in accordance with some embodiments of the present disclosure.

FIG. 5 is a schematic side sectional view in the X-Z plane of an example of a device package 501. In some embodiments, the device package 501 of FIG. 5 may be similar to the device package 201 described above, and therefore the description of similar features is omitted for brevity. In some embodiments, the device package 501 comprises a cooling assembly 503 within a package cover 508. The cooling assembly 503 comprises a manifold 510, a first semiconductor device 504, a second semiconductor device 506, a third semiconductor device 512, a fourth semiconductor device 514, a first cold plate 516, and a second cold plate 518. In some embodiments, the device package 501 comprises some semiconductor devices with cold plates directly bonded to the backside surfaces of the semiconductor devices and other chips without cold plates directly bonded to the backside surfaces of the semiconductor devices. For example, the second semiconductor device 506 and the third semiconductor device 512 have cold plates (e.g., first cold plate 516 and second cold plate 518 respectively) bonded to the backside surfaces of the semiconductor devices and the first semiconductor device 504 and the fourth semiconductor device 514 do not have cold plates bonded to the backside surfaces of the semiconductor devices.

In some embodiments, the device package 501 comprises a first TIM 526 between one or more cold plates (e.g., first cold plate 516) and the manifold 510. In some embodiments, the device package 501 also comprises a second TIM 536 between the manifold 510 and the package cover 508. Although the first TIM 526 and the second TIM 536 are show, the device package 501 may only comprise one of the first TIM 526 and the second TIM 536. In some embodiments, the device package 501 does not comprise both the first TIM 526 and the second TIM 536.

In some embodiments, the manifold 510 comprises a first set of coolant channels 524. The first set of coolant channels 524 may be generated and/or may function using any of the techniques described herein. In some embodiments, the first set of coolant channels 524 allow for coolant to flow through one or more cold plates in parallel. For example, coolant may travel from a first inlet openings 506A, through one or more coolant channels in the manifold 510 into a second inlet opening 528 of the first cold plate 516 and a third inlet opening 530 of the second cold plate 518. The coolant may then flow through one or more coolant channels in the cold plates (e.g., first cold plate 516 and second cold plate 518) and exit the cold plates via outlet openings (e.g., second outlet opening 532 and third outlet opening 534) of the respective cold plates. The coolant may then flow through one or more coolant channels in the manifold 510 into an outlet opening 506A.

In some embodiments, the manifold 510 also provides for thermal dissipation for devices without a cold plate. For example, the first semiconductor device 504 and the fourth semiconductor device 514 are not coupled to cold plates. Heat generated by the first semiconductor device 504 and the fourth semiconductor device 514 may transfer through the first TIM 526, the manifold 510, and/or the second TIM 536. The heat generated by the first semiconductor device 504 and the fourth semiconductor device 514 may then be dissipated by the coolant flowing through the first set of coolant channels 524. In some embodiments, the first TIM 526, the second TIM 536 and/or the manifold 510 are formed from materials with high thermal conductivity to allow the heat to be transferred from the first semiconductor device 504 and the fourth semiconductor device 514 to the coolant flowing through the first set of coolant channels 524.

In some embodiments, the manifold 510 is configured to couple with one or more devices and/or cold plates, wherein the one or more devices and/or cold plates extend to the same height. For example, the first semiconductor device 504 and the first cold plate 516 may both extend to a first vertical height and the manifold 510 may be configured to couple with the first semiconductor device 504 and the first cold plate 516. In some embodiments, the manifold 510 is configured to couple with one or more devices and/or cold plates, wherein the one or more devices and/or cold plates do not extend to the same height. For example, the first cold plate 516 may extend to a first vertical height and the second cold plate 518 may extend to a second vertical height. The first vertical height may be different than the second vertical height and the manifold 510 may be configured to couple with both the first cold plate 516 and the second cold plate 518 despite the difference in vertical height. For example, the manifold 510 may have one or more protrusions or recessions to facilitate coupling with the different heights.

In some embodiments, one or more cold plates are configured according to the thicknesses of one or more semiconductor devices. For example, the second semiconductor device 506 may have a first thickness and the third semiconductor device 512 may have a second thickness. The first thickness may be different than the second thickness. In some embodiments, the first cold plate 516 is designed so that that a first combined thickness of the first cold plate 516 and the second semiconductor device 506 is the same or similar to a second combined thickness of the second cold plate 518 and the third semiconductor device 512. For example, if the first thickness of the second semiconductor device 506 is less than the thickness of the third semiconductor device 512 then the thickness of the first cold plate 516 may be greater than the thickness of the second cold plate 518.

In some embodiments, the vertical difference between thicknesses of the second semiconductor device 506 and the third semiconductor device 512 is the same or similar to the vertical difference between the thickness of the first cold plate 516 and the thickness of the second cold plate 518. For example, the first thickness of the second semiconductor device 506 may be 2 mm less the second thickness of the third semiconductor device 512. In such an example, the thickness of the first cold plate 516 may be 2 mm greater than the thickness of the second cold plate 518 so that the combined vertical height of the second semiconductor device 506 and the first cold plate 516 is the same or similar to the combined vertical height of the third semiconductor device 512 and the second cold plate 518.

Figure 6:
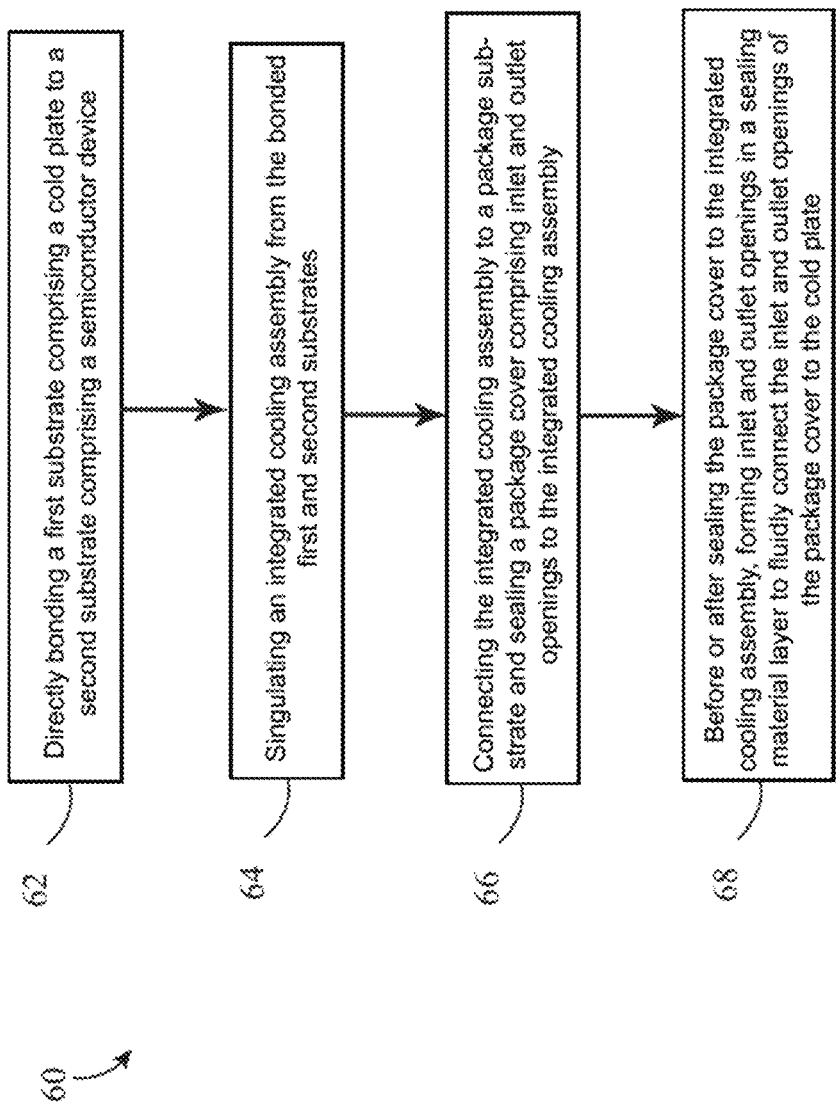
FIG. 6 shows a method that can be used to manufacture the device package, in accordance with some embodiments of the disclosure.

FIG. 6 is a flow diagram setting forth a method 60 of forming an integrated cooling assembly, according to embodiments of the disclosure. Generally, the method includes bonding a first substrate comprising one or more cold plates 206 to a second substrate comprising one or more semiconductor devices 204, and singulating one or more integrated cooling assemblies 203 from the bonded first and second substrates. For example, wafer (bare or reconstituted wafer) comprising one or more cold plates 206 can be directly bonded to another wafer (bare or reconstituted wafer) comprising one or more semiconductor devices 204.

It will be understood that the first substrate may be a cold plate die or part of a wafer of cold plates. Further, the second substrate may be a semiconductor device die or part of a wafer of semiconductor devices 204. Therefore, the method 60 may include die-to-die direct bonding (e.g., cold plate die to semiconductor device die), water-to-die direct bonding (e.g., cold plate die to semiconductor device wafer, or cold plate wafer to semiconductor device die), and wafer-to-wafer direct bonding (e.g., cold plate wafer to semiconductor device wafer). It will be understood that the singulation step (discussed in relation to block 64, below) may not be required for a die-to-die direct bonding operation.

As mentioned above, in some embodiments, the first substrate may comprise multiple cold plates and the second substrate may comprise multiple semiconductor devices, such that plural integrated cooling assemblies 203 may be formed from the first and second substrates. For simplicity, the following description is focused on forming a single cold plate (e.g., the first cold plate 206) and a single semiconductor device (e.g., the first semiconductor device 204) of the multiple semiconductor device and multiple cold plates. The same or similar such methodologies may be used when preparing additional cold plates and/or semiconductor devices.

At block 62, the method 60 includes directly bonding the first substrate (e.g., a monocrystalline silicon wafer) comprising a first cold plate 206 to the second substrate (e.g., a monocrystalline silicon wafer) comprising a first semiconductor device 204 without an intervening adhesive.

In some embodiments, the first substrate may be etched using a patterned mask layer formed on its surface to form features of the first cold plate 206. An anisotropic etch process may be used, which uses inherently differing etch rates for the silicon material as between {100} plane surfaces and {111} plane surfaces when exposed to an anisotropic etchant.

In some embodiments, the etching process is controlled to where the etch rates of the substrate surfaces have a ratio between about 1:10 and about 1:200, such as between about 1:10 and about 1:100, for example between about 1:10 and 1:50, or between about 1:25 and 1:75. Examples of suitable anisotropic wet etchants include aqueous solutions of potassium hydroxide (KOH), ethylene diamine and pyrocatechol (EPD), ammonium hydroxide ($HN_4OH$), hydrazine ($N_2H_4$), or tetra methyl ammonium hydroxide (TMAH). The actual etch rates of the silicon substrate depend on the concentration of the etchant in the aqueous solution, the temperature of the aqueous solution, and a concentration of the dopant in the substrate (if any). Typically, the mask layer is formed of a material which is selective to anisotropic etch compared to the underlying monocrystalline silicon substrate. Examples of suitable mask materials include silicon oxide ($Si_xO_y$) or silicon nitride ($Si_xN_y$). In some embodiments, the mask layer has a thickness of about 100 nm or less, such as about 50 nm or less, or about 30 nm or less. The mask layer may be patterned using any suitable combination of lithography and material etching patterning methods.

The second substrate may include a bulk material, and a plurality of material layers disposed on the bulk material. The bulk material may include any semiconductor material suitable for manufacturing semiconductor devices, such as silicon, silicon carbide, silicon germanium, germanium, group III-V semiconductor materials, group II-VI semiconductor materials, or combinations thereof. While some high-performance processors like central processing units (CPUs), graphics processing units (GPUs), neural processing units (NPUs), and tensor processing units (TPUs) are typically made out of silicon, some other high-power density (hence substantial heat generating) devices may comprise silicon carbide or gallium nitride, for example. In some embodiments, the second substrate may include a monocrystalline wafer, such as a silicon wafer, a plurality of device components formed in or on the silicon wafer, and a plurality of interconnect layers formed over the plurality of device components. In other embodiments, the second substrate may comprise a reconstituted substrate (e.g., a substrate formed from a plurality of singulated devices embedded in a support material). In some embodiments, each semiconductor device may have its own individual cold plate fabricated through a reconstitution process.

The bulk material of the second substrate may be thinned after the first semiconductor device 204 is formed using one or more backgrinding, etching, and polishing operations that remove material from the backside. Thinning the second substrate may include using a combination of grinding and etching processes to reduce the thickness (in the Z-direction) to about 450 μm or less, such as about 200 μm or less, or about 150 μm or less or about 50 μm or less. After thinning, the backside 220 may be polished to a desired smoothness using a chemical mechanical polishing (CMP) process, and the dielectric material layer may be deposited thereon. In some embodiments, the dielectric material layer may be polished to a desired smoothness to prepare the second substrate for the bonding process. In some embodiments, the method 60 includes forming a plurality of metal features in the dielectric material layer in preparation for a hybrid bonding process, such as by use of a damascene process.

In some embodiments, the active side of the second substrate is temporarily bonded to a carrier substrate (not shown) before or after the thinning process. When used, the carrier substrate provides support for the thinning operation and/or for the thinned material to facilitate substrate handling during one or more of the subsequent manufacturing operations described herein.

Here, the method 60 may include forming dielectric layers on one or both the first and second substrates, and directly bonding includes forming dielectric bonds between a first dielectric material layer of the first substrate and a second dielectric material layer of the second substrate (or forming dielectric bonds between one substrate and a dielectric material layer of the other substrate). Direct bonding processes join dielectric layers by forming strong chemical bonds (e.g., covalent bonds) between the dielectric layers.

Generally, directly bonding the surfaces (of the dielectric material layers formed on the first and second substrates) includes preparing, aligning, and contacting the surfaces. Examples of dielectric material layers include silicon oxide, silicon nitride, silicon oxynitride, and silicon carbonitride. Preparing the surfaces may include smoothing the respective surfaces to a desired surface roughness, such as between 0.1 to 3.0 nm RMS, activating the surfaces to weaken or open chemical bonds in the dielectric material, and terminating the surfaces with a desired species. Smoothing the surfaces may include polishing the first and second substrates using a CMP process. Activating and terminating the surfaces with a desired species may include exposing the surfaces to radical species formed in a plasma. The bond interface between the bonded dielectric layers can include a higher concentration of materials from the activation and/or last chemical treatment processes compared to the bulk of the bonding layers. For example, some embodiments that utilize a nitrogen plasma for activation, a nitrogen concentration peak can be formed at the bond interface. In some embodiments, the nitrogen concentration peak may be detectable using secondary ion mass spectroscopy (SIMS) techniques. In various embodiments, for example, a nitrogen termination treatment (e.g., exposing the bonding surface to a nitrogen-containing plasma) can replace OH groups of a hydrolyzed (OH-terminated) surface with $NH_2$ molecules, yielding a nitrogen-terminated surface. In embodiments that utilize an oxygen plasma for activation, an oxygen concentration peak can be formed at the bond interface between non-conductive bonding surfaces.

In some embodiments, the plasma is formed using a nitrogen-containing gas (e.g., $N_2$), and the terminating species includes nitrogen, or nitrogen and hydrogen. In some embodiments, fluorine may also be present within the plasma. In some embodiments, the surfaces may be activated using a wet cleaning process (e.g., by exposing the surfaces to an aqueous ammonia solution). In some embodiments, the dielectric bonds may be formed using a dielectric material layer deposited on only one of the first and second substrates, but not on both. In those embodiments, the direct dielectric bonds may be formed by contacting the deposited dielectric material layer of one of the first and second substrates directly with a bulk material surface (or such a surface with a native oxide) of the other substrate.

Directly forming direct dielectric bonds between the first and second substrates at block 62 may include bringing the prepared and aligned surfaces into direct contact at a temperature less than 150° C., such as less than 100° C., for example, less than 30° C., or about room temperature, e.g., between 20° C. and 30° C. Without intending to be bound by theory, in the case of directly bonding surfaces terminated with nitrogen and hydrogen (e.g., $NH_2$ groups), it is believed that the hydrogen terminating species diffuse from the interfacial bonding surfaces, and chemical bonds are formed between the remaining nitrogen species during the direct bonding process. In some embodiments, the direct bond is strengthened using an anneal process, where the substrates are heated to and maintained at a temperature of greater than about 30° C. and less than about 450° C., for example, greater than about 50° C. and less than about 250° C., or about 150° C. for a duration of about 5 minutes or more, such as about 15 minutes. Typically, the bonds will strengthen over time even without the application of heat. Thus, in some embodiments, the method does not include heating the substrates.

In embodiments where the first and second substrates are bonded using hybrid dielectric and metal bonds, the method 60 may further include planarizing or recessing the metal features below the dielectric field surface before contacting and bonding the dielectric material layers. After the dielectric bonds are formed, the first and second substrates may be heated to a temperature of 150° C. or more and maintained at the elevated temperature for a duration of about 1 hour or more (e.g., between 8 and 24 hours) to form direct metallurgical bonds between the metal features.

Suitable direct dielectric and hybrid bonding technologies that may be used to perform aspects of the methods described herein include ZiBond® and DBI®, each of which are commercially available from Adeia Holding Corp., San Jose, CA, USA.

At block 64, the method 60 includes singulating at least one integrated cooling assembly 203 from the bonded first and second substrates. Singulation after bonding may impart distinctive structural characteristics on the integrated cooling assembly 203 as the bonding surface of the one or more cold plates have the same perimeter as the backside of the one or more semiconductor device bonded thereto. Thus, the sidewalls (e.g., side surfaces) of the one or more cold plates may be flush with the edges (e.g., side surfaces) of the respective semiconductor devices about their common perimeters. In some embodiments, the first cold plate 206 is singulated from the first substrate using a process that cuts or divides the first substrate in a vertical plane (i.e., in the Z-direction). In those embodiments, the side surfaces of the first cold plate 206 are substantially perpendicular to the backside 220 of the first semiconductor device 204 (i.e., a horizontal (X-Y) plane of an attachment interface between the first semiconductor device 204 and the first cold plate 206). In some embodiments, the first cold plate 206 is singulated using a saw or laser dicing process.

At block 66, the method may include connecting the integrated cooling assembly 203 to the package substrate 202 and sealing a package cover 208 comprising inlet and outlet openings 212 to the integrated cooling assembly 203 by use of a molding compound that when cured, forms a sealing material layer 222. In some embodiments, a manifold 210 is adhered to the top of one or more cold plates before the package cover 208 is sealed.

At block 68, the method 60 may include, before or after sealing the package cover 208 to the integrated cooling assembly 203, forming inlet and outlet openings 222A in the sealing material layer 222 to fluidly connect the inlet and outlet openings 212 of the package cover 208 to inlet and outlet opening of the first cold plate 206 (e.g., via the manifold 210).

Figure 7:
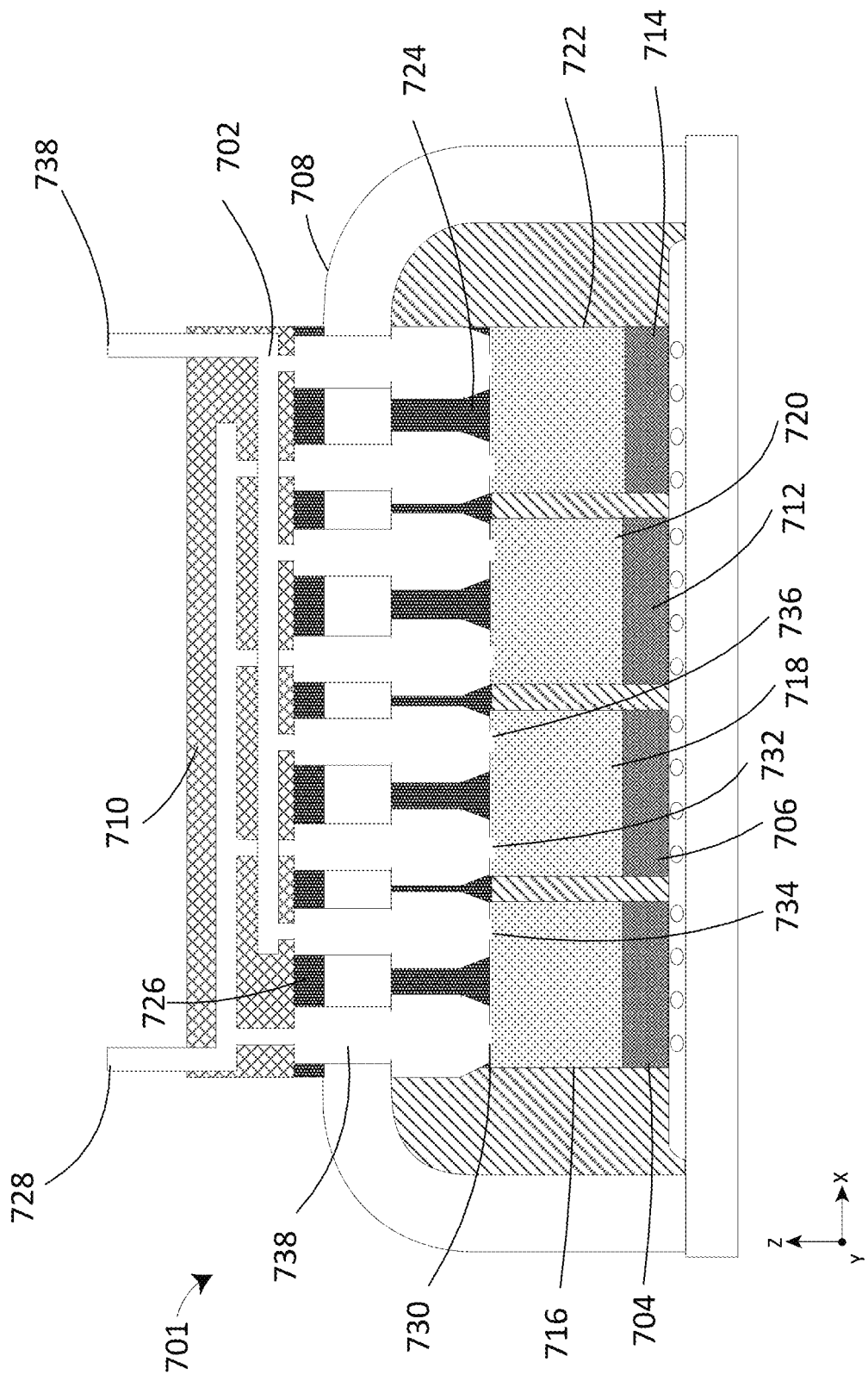
FIG. 7 is another schematic sectional view of an example device package that may be used with the system panel, in accordance with some embodiments of the present disclosure.

FIG. 7 is another schematic sectional view of an example device package 701, in accordance with some embodiments of the present disclosure. In some embodiments, the device package 701 of FIG. 7 may be similar to the device package 201 described above, and therefore the description of similar features is omitted for brevity. In some embodiments, a manifold 710 of FIG. 7 is located outside of the package cover 708. In some embodiments, the manifold 710 is attached to the package cover 708 via one or more adhesives. In some embodiments, the one or more adhesives are non-permanent adhesives. In some embodiments, the manifold 710 is attached to the package cover 708 via one or more gaskets and/or one or more O-rings.

In some embodiments, the device package 701 comprises a manifold 710, a first semiconductor device 704, a second semiconductor device 706, a third semiconductor device 712, a fourth semiconductor device 714, a first cold plate 716, a second cold plate 718, a third cold plate 720, and a fourth cold plate 722. In some embodiments, the device package 701 comprises a first TIM 724 between one or more cold plates (e.g., first cold plate 716) and the package cover 708. In some embodiments, there may be a second TIM 726 between the package cover 708 and the manifold 710. Although the first TIM 724 and second TIM 726 are shown, one or more of the TIMs may not be included in some embodiments.

In some embodiments, the manifold 710 comprises a first set of coolant channels 702. The first set of coolant channels 702 may be generated and/or may function using any of the techniques described herein. In some embodiments, the first set of coolant channels 702 allow for coolant to flow through one or more cold plates in parallel. For example, coolant may travel from a first inlet openings 728, through one or more coolant channels in the manifold 710, through one or more openings in the package cover 708, into inlet openings of both the first cold plate 716 and the second cold plate 718 (e.g., second inlet opening 730 and third inlet opening 732). The coolant may then flow through one or more coolant channels in the cold plates (e.g., first cold plate 716 and second cold plate 718) and exit the cold plates via outlet openings (e.g., first outlet opening 734 and second outlet opening 736) of the respective cold plates. The coolant may then flow through one or more outlets in the package cover 708 and into the manifold 710. The coolant may then flow through one or more coolant channels in the manifold 710 and then exit the manifold 710 through the first package cover opening 738.

In some embodiments, the manifold 710 is configured to couple with one or more openings in the package cover 708. Although FIG. 7 shows eight openings in the package cover 708, the package cover 708 may have more or less package cover openings. In some embodiment, one or more package cover openings (e.g., first package cover opening 738) comprise a portion that extends above the top portion of the package cover 708. In some embodiment, one or more package cover openings comprise a portion below the top portion of the package cover 708. In some embodiments, the manifold 710 comprises one or more protrusions or recessions to facilitate coupling with one or more package cover openings and/or one or more portions of the package cover openings.

In some embodiments, one or more cold plates are configured according to the thicknesses of one or more semiconductor devices. In some embodiments, the first cold plate 716 is designed so that that a first combined thickness of the first cold plate 716 and the first semiconductor device 704 is the same or similar to a second combined thickness of the second cold plate 718 and the second semiconductor device 706. In some embodiments, the vertical difference between thicknesses of the first semiconductor device 704 and the second semiconductor device 706 is the same or similar to the vertical difference between the thickness of the first cold plate 716 and the thickness of the second cold plate 718.

Figure 8:
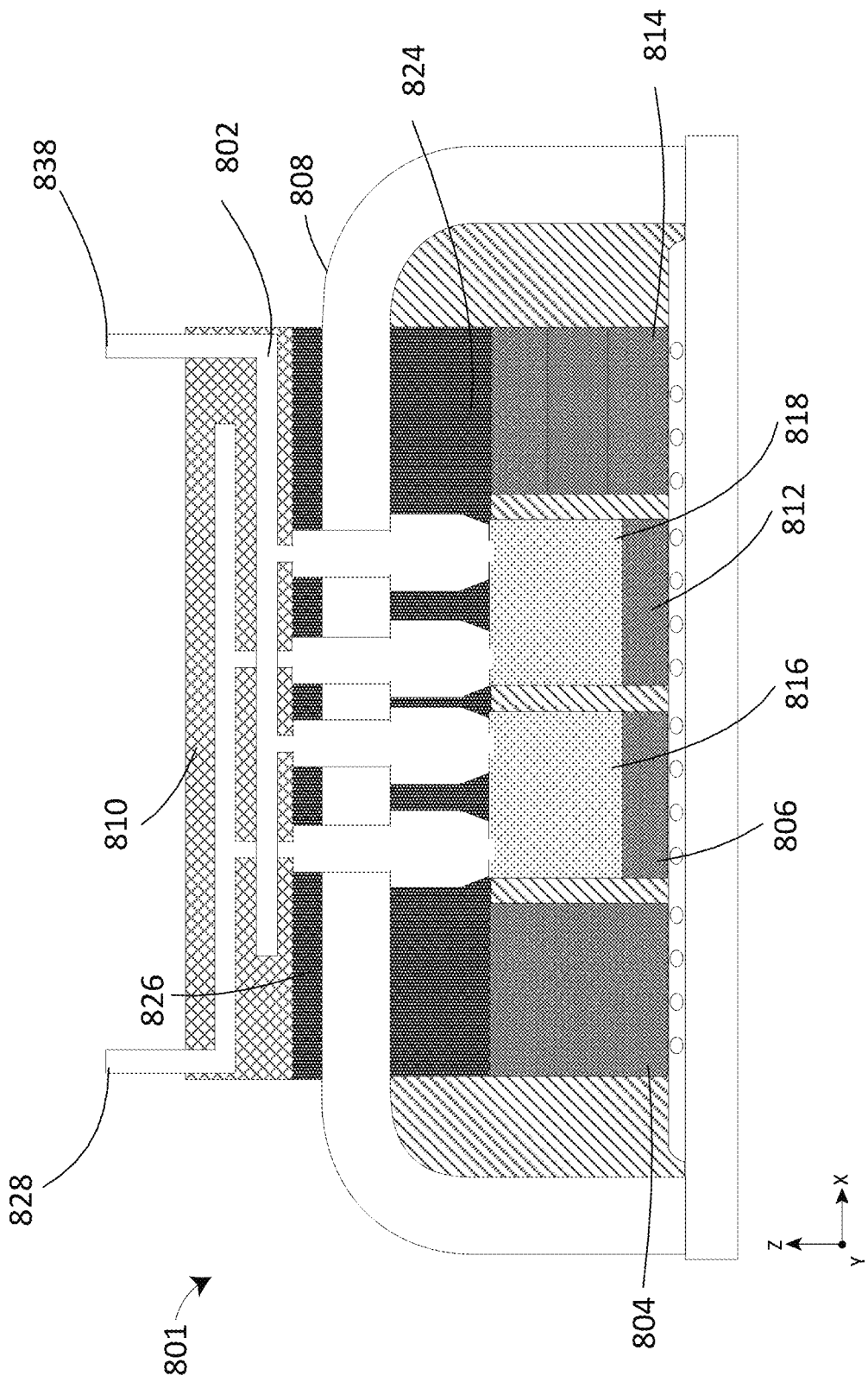
FIG. 8 is another schematic sectional view of an example device package that may be used with the system panel, in accordance with some embodiments of the present disclosure.

FIG. 8 is another schematic sectional view of an example device package 801, in accordance with some embodiments of the present disclosure. In some embodiments, the device package of FIG. 8 may be similar to the device package 201 described above, and therefore the description of similar features is omitted for brevity. In some embodiments, a manifold 810 of FIG. 8 is located outside of the package cover 808. In some embodiments, the manifold 810 is attached to the package cover 808 via one or more adhesives. In some embodiments, the one or more adhesives are non-permanent adhesives. In some embodiments, the manifold 810 is attached to the package cover 808 via one or more gaskets and/or one or more O-rings.

In some embodiments, the device package 801 comprises the manifold 810, a first semiconductor device 804, a second semiconductor device 806, a third semiconductor device 812, a fourth semiconductor device 814, a first cold plate 816, and a second cold plate 818. In some embodiments, the device package 801 comprises a first TIM 724 between one or more cold plates (e.g., first cold plate 816) and the package cover 808. In some embodiments, there may be a second TIM 826 between the package cover 808 and the manifold 810. Although the first TIM 824 and second TIM 826 are shown, one or more of the TIMs may not be included in some embodiments.

In some embodiments, the manifold 810 comprises a first set of coolant channels 802. The first set of coolant channels 802 may be generated and/or may function using any of the techniques described herein. In some embodiments, the first set of coolant channels 802 allow for coolant to flow through one or more cold plates in parallel. For example, coolant may travel from a first inlet openings 828, through one or more coolant channels in the manifold 810, through one or more openings in the package cover 808, into inlet openings of both the first cold plate 816 and the second cold plate 818. The coolant may then flow through one or more coolant channels in the cold plates (e.g., first cold plate 816 and second cold plate 818) and exit the cold plates via outlet openings of the respective cold plates. The coolant may then flow through one or more outlets in the package cover 808 and into the manifold 810. The coolant may then flow through one or more coolant channels in the manifold 810 and then exit the manifold 810 through a first outlet opening 838.

In some embodiments, the manifold 810 also provides for thermal dissipation for devices without a cold plate. For example, the first semiconductor device 804 and the fourth semiconductor device 814 are not coupled to cold plates. Heat generated by the first semiconductor device 804 and/or the fourth semiconductor device 814 may transfer through the first TIM 824, package cover 808, the second TIM 826, and the manifold 810. The heat generated by the first semiconductor device 804 and the fourth semiconductor device 814 may then be dissipated by the coolant flowing through the first set of coolant channels 802. In some embodiments, the first TIM 824, the package cover 808, the second TIM 826 and/or the manifold 810 are formed from materials with high thermal conductivity to allow the heat to be transferred from the first semiconductor device 804 and/or the fourth semiconductor device 814 to the coolant flowing through the first set of coolant channels 802.

In some embodiments, one or more TIMS provide for thermal dissipation for devices without a cold plate. For example, heat generated by the first semiconductor device 804 and/or the fourth semiconductor device 814 may transfer through the first TIM 824 to the first cold plate 816, one or more inlet/outlets for the first cold plate 816, the second cold plate 818, and/or one or more inlet/outlets for the second cold plate 818. The heat generated by the first semiconductor device 804 and the fourth semiconductor device 814 may then be dissipated by the coolant flowing through the first cold plate 816, one or more inlet/outlets for the first cold plate 816, the second cold plate 818, and/or one or more inlet/outlets for the second cold plate 818. In some embodiments, the first TIM 824 is formed from materials with high thermal conductivity to allow the heat to be transferred from the first semiconductor device 804 and/or the fourth semiconductor device 814 to the coolant flowing through the first cold plate 816, one or more inlet/outlets for the first cold plate 816, the second cold plate 818, and/or one or more inlet/outlets for the second cold plate 818. In some embodiments, the second TIM 826 and/or the manifold 810 are formed from materials with low thermal conductivity to reduce heat directly transferring from the first semiconductor device 804 and/or the fourth semiconductor device 814 to the coolant channels 802 of the manifold 810.

In some embodiments, the manifold 810 is configured to couple with one or more openings in the package cover 808. Although FIG. 8 shows four openings in the package cover 808, the package cover 808 may have more or less package cover openings. In some embodiment, one or more package cover openings comprise a portion that extends above the top portion of the package cover 808. In some embodiment, one or more package cover openings comprise a portion below the top portion of the package cover 808. In some embodiments, the manifold 810 comprises one or more protrusions or recessions to facilitate coupling with one or more package cover openings and/or one or more portions of the package cover openings.

In some embodiments, one or more cold plates are configured according to the thicknesses of one or more semiconductor devices. In some embodiments, the first cold plate 816 is designed so that that a first combined thickness of the first cold plate 816 and the second semiconductor device 806 are the same or similar to a second combined thickness of the second cold plate 818 and the third semiconductor device 812. In some embodiments, the vertical difference between thicknesses of the second semiconductor device 806 and the third semiconductor device 812 is the same or similar to the vertical difference between the thickness of the first cold plate 816 and the thickness of the second cold plate 818.

FIG. 9 is a schematic top view of an example of a portion of a device package 901 that may be used with the system panel, in accordance with some embodiments of the present disclosure. In some embodiments, the portion of a device package 901 comprises a plurality of semiconductor devices coupled to a substrate 902. In some embodiments, one or more semiconductor devices of the plurality of semiconductor devices are coupled to one or more cold plates. For example, a first cold plate 904 may be coupled to the backside of a first semiconductor device and a second cold plate 906 may be coupled to the backside of a second semiconductor device.

In some embodiments, one or more cold plates comprise one or more inlets and/or outlets. For example, the first cold plate 904 comprises a first inlet 908 and a first outlet 912 and the second cold plate 906 comprises a second inlet 910 and a second outlet 914. In some embodiments, the one or more inlets and/or one or more outlets allow coolant to flow through the one or more cold plates. For example, coolant may flow into the first cold plate 904 using the first inlet 908 then flow through one or more coolant chamber volumes within the first cold plate 904. The coolant may then exit the first cold plate 904 using the first outlet 912.

Figure 10A:
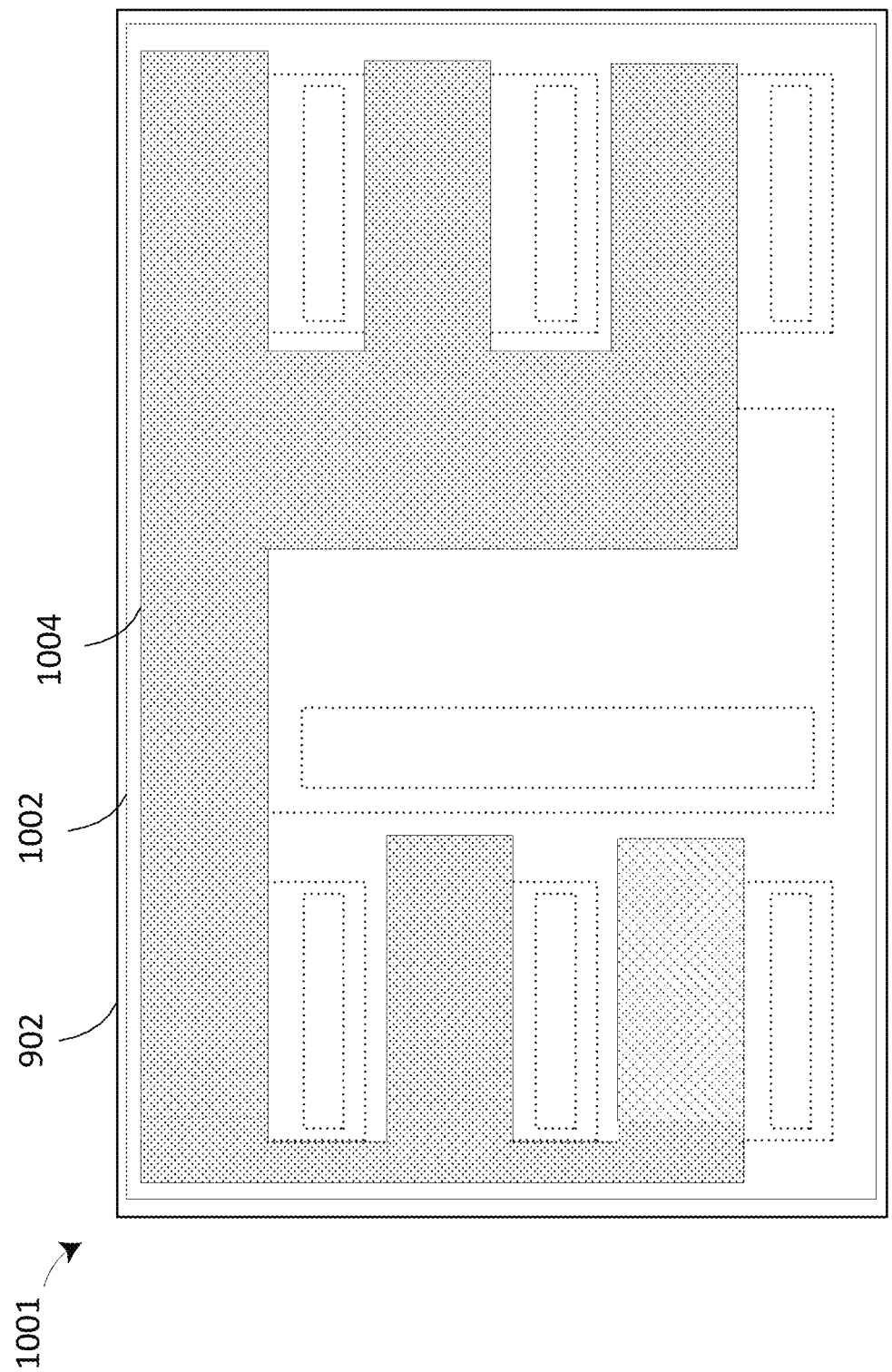
FIGS. 10A and 10B are schematic top views of an example of a portion of a device package that may be used with the system panel, in accordance with some embodiments of the present disclosure.
Figure 10B:
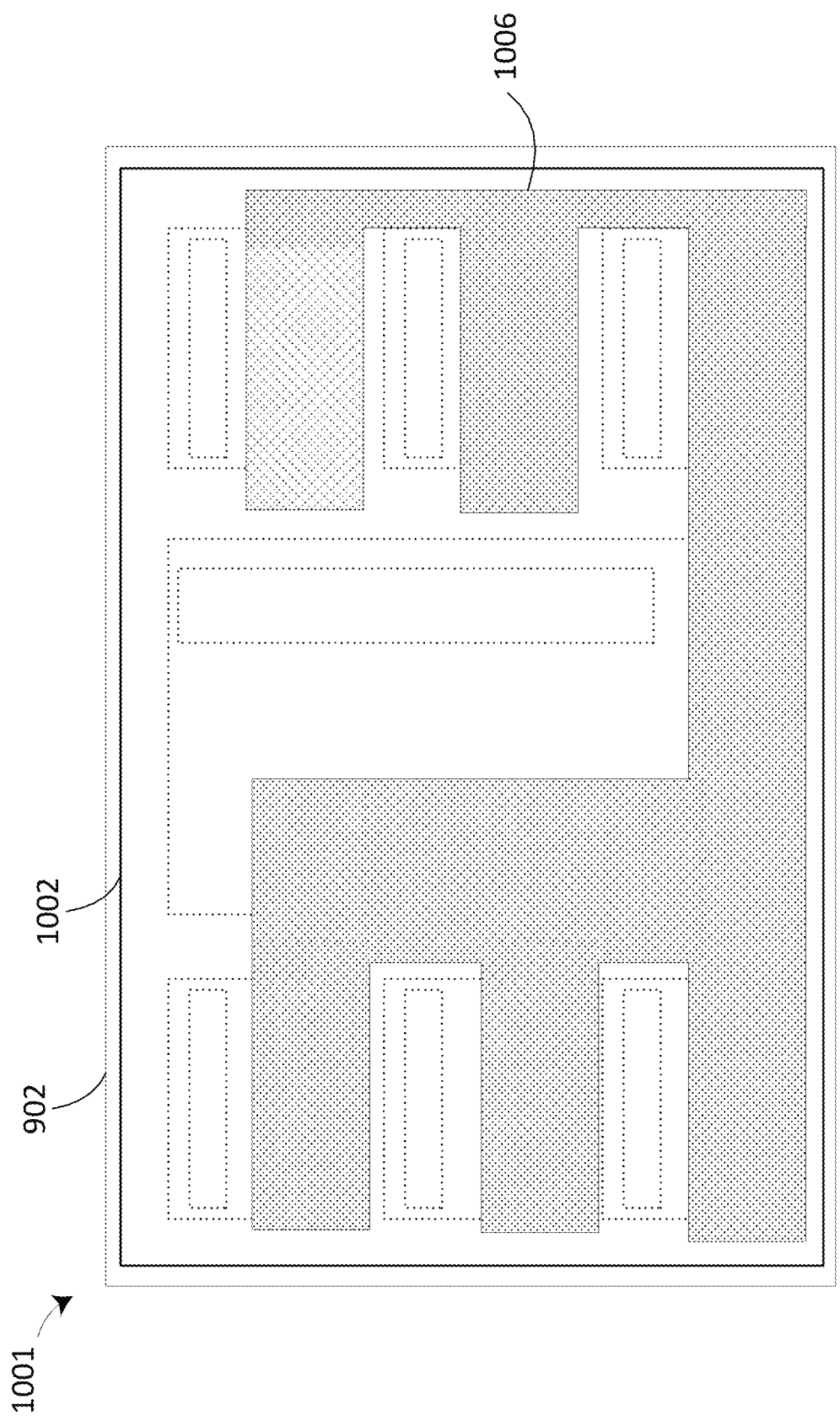

FIGS. 10A and 10B are schematic top views of an example of a portion of a device package 1001 that may be used with the system panel, in accordance with some embodiments of the present disclosure. In some embodiments, the portion of a device package 1001 comprises a manifold 1002 and a substrate 902. In some embodiments, a plurality of semiconductor devices are coupled to the substrate 902. In some embodiments, the plurality of semiconductor devices and the substrate 902 are the same or similar to the plurality of semiconductor devices and the substrate 902 described at FIG. 9. In some embodiments, the device packages of FIGS. 9-10B may be similar to the device package 201 described above, and therefore the description of similar features is omitted for brevity.

The manifold 1002 may be coupled to one or more cold plates (e.g., first cold plate 904 and second cold plate 906) to allow coolant to flow between the one or more cold plates and the manifold 1002. In some embodiments, the manifold 1002 comprises a first coolant chamber volume 1004 and a second coolant chamber volume 1006. In some embodiments, the first coolant chamber volume 1004 delivers coolant to one or more cold plate inlets (e.g., first inlet 908 and second inlet 910) and the second coolant chamber volume 1006 receives coolant from one or more cold plate outlets (e.g., first outlet 912 and second outlet 914). For example, coolant may flow into the manifold 1002 and into the first coolant chamber volume 1004. The coolant may flow from the first coolant chamber volume 1004 into one or more cold plate inlets (e.g., first inlet 908 and second inlet 910). The coolant may then flow through the one or more cold plates (e.g., first cold plate 904 and second cold plate 906) cooling one or more semiconductor devices. The coolant may then flow from the one or more cold plates via cold plate outlets (e.g., first outlet 912 and second outlet 914) into the second coolant chamber volume 1006. The coolant may then exit the manifold 1002 via one or more manifold outlets.

Figure 11:
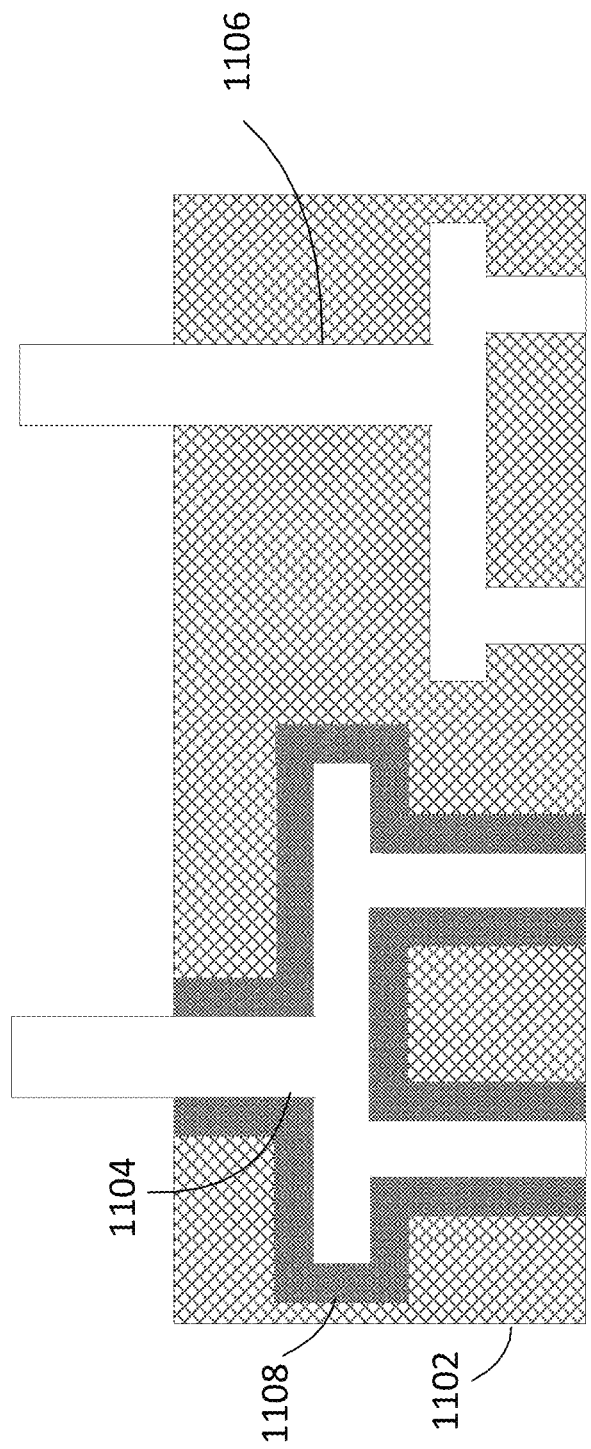
FIG. 11 is a sectional view of an example of a portion of a device package that may be used with the system panel, in accordance with some embodiments of the present disclosure.

FIGS. 11-15 are sectional views of examples of portions of one or more device packages that may be used with the system panel, in accordance with some embodiments of the present disclosure. FIG. 11 shows a manifold 1102 comprising a first coolant chamber volume 1104 and a second coolant chamber volume 1106.

In some embodiments, the first coolant chamber volume 1104 may allow coolant to flow from a coolant inlet to one or more cold plates attached to one or more semiconductor devices. The second coolant chamber volume 1106 may allow coolant to flow from the one or more cold plates attached to the one or more semiconductor devices. In some embodiments, the coolant in the first coolant chamber volume 1104 has a lower temperature than the coolant in the second coolant chamber volume 1106. For example, the coolant in the second coolant chamber volume 1106 may have already passed through the one or more cold plates attached to the one or more semiconductor devices allowing heat generated from the one or more semiconductor devices to dissipate into the coolant.

In some embodiments, the manifold 1102 comprises an insulator layer 1108 to increase chip cooling. In some embodiments, the insulator layer 1108 prevents heat from being transferred to coolant chamber volumes comprising incoming coolant fluid received from a coolant line. For example, the insulator layer 1108 may prevent heat from the second coolant chamber volume 1106 from dissipating through the manifold 1102 to the first coolant chamber volume 1104 heating the coolant before the coolant is able to pass through the first coolant chamber volume 1104 and cool the one or more semiconductor devices. In some embodiments, the first coolant chamber volume 1104 is surrounded by the insulator layer 1108, reducing heat transfer between the second coolant chamber volume 1106 and the first coolant chamber volume 1104.

Figure 12:
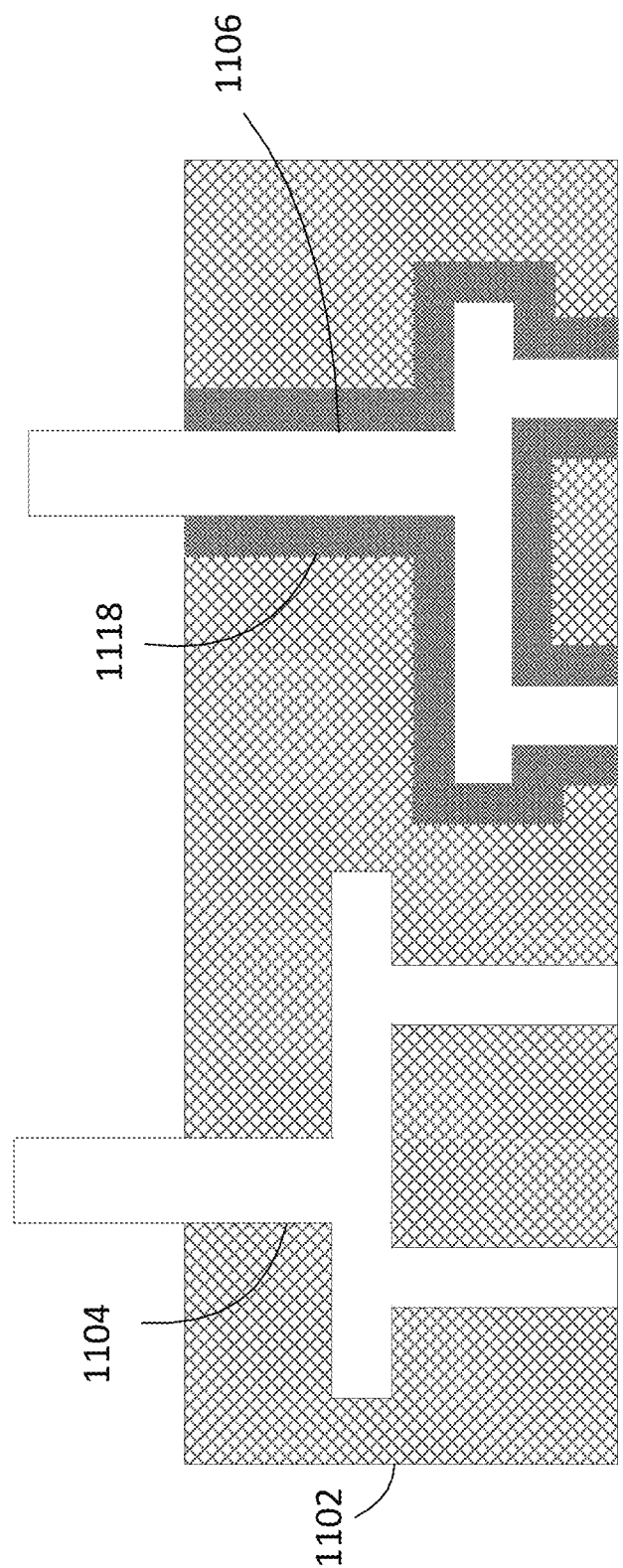
FIG. 12 is another sectional view of an example of a portion of a device package that may be used with the system panel, in accordance with some embodiments of the present disclosure.

FIG. 12 displays the same or similar manifold 1102, first coolant chamber volume 1104, and second coolant chamber volume 1106. However, the manifold 1102 of FIG. 12 comprises an insulator layer 1118 surrounding the second coolant chamber volume 1106. In some embodiments, the insulator layer 1118 surrounding the second coolant chamber volume 1106 reduces the heat transfer between the second coolant chamber volume 1106 and the first coolant chamber volume 1104.

Figure 13:
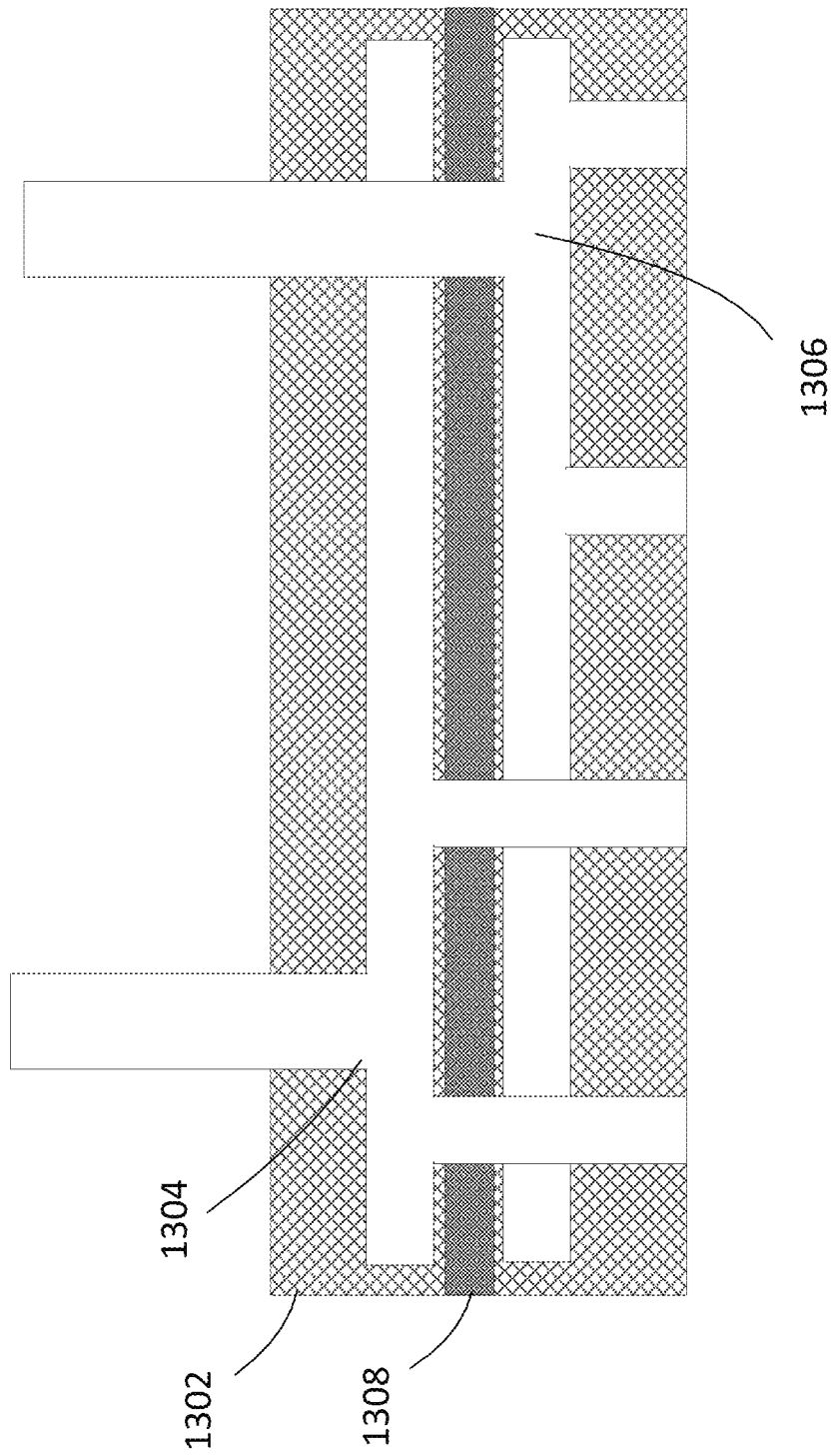
FIG. 13 is another sectional view of an example of a portion of a device package that may be used with the system panel, in accordance with some embodiments of the present disclosure.

FIG. 13 shows a manifold 1302 comprising a first coolant chamber volume 1304 and a second coolant chamber volume 1306. In some embodiments, the first coolant chamber volume 1304 allows coolant to flow from a coolant inlet to one or more cold plates attached to one or more semiconductor devices and the second coolant chamber volume 1306 allows coolant to flow from the one or more cold plates attached to the one or more semiconductor devices to the second coolant chamber volume 1306. In some embodiments, the coolant in the first coolant chamber volume 1304 has a lower temperature than the coolant in the second coolant chamber volume 1306.

In some embodiments, the manifold 1302 comprises an insulator layer 1308 to increase chip cooling. In some embodiments, the insulator layer 1308 is disposed between a portion of the first coolant chamber volume 1304 and a portion of the second coolant chamber volume 1306, reducing heat transfer between the second coolant chamber volume 1306 and the first coolant chamber volume 1304.

Figure 14:
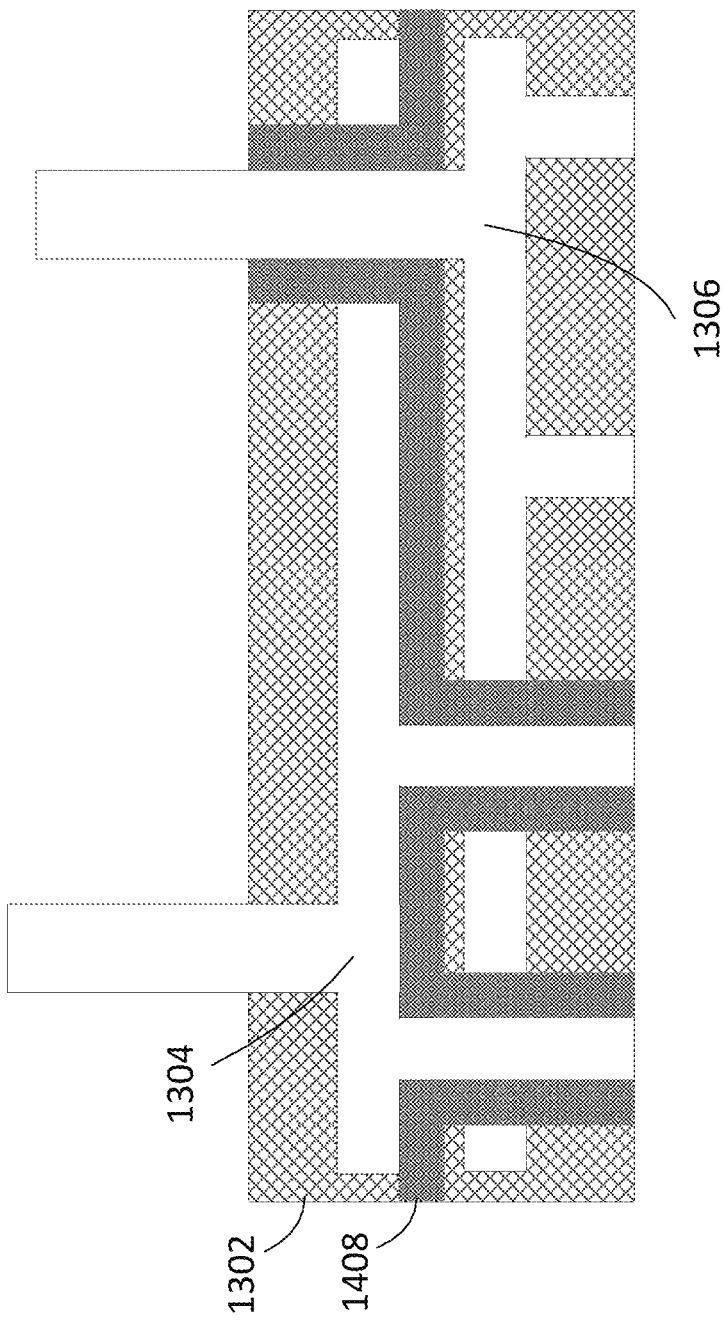
FIG. 14 is another sectional view of an example of a portion of a device package that may be used with the system panel, in accordance with some embodiments of the present disclosure.

FIG. 14 displays the same or similar manifold 1302, first coolant chamber volume 1304, and second coolant chamber volume 1306 as FIG. 13. However, the manifold 1302 of FIG. 14 comprises an insulator layer 1408 surrounding portions of the first coolant chamber volume 1304 and portions of the second coolant chamber volume 1306. In some embodiments, the insulator layer 1408 surrounds portions of the first coolant chamber volume 1304 that overlap with portions of the second coolant chamber volume 1306 in the X, Y, and/or Z direction. In some embodiments, the insulator layer 1408 surrounds portions of the second coolant chamber volume 1306 that overlap with portions of the first coolant chamber volume 1304 in the X, Y, and/or Z direction.

Figure 15:
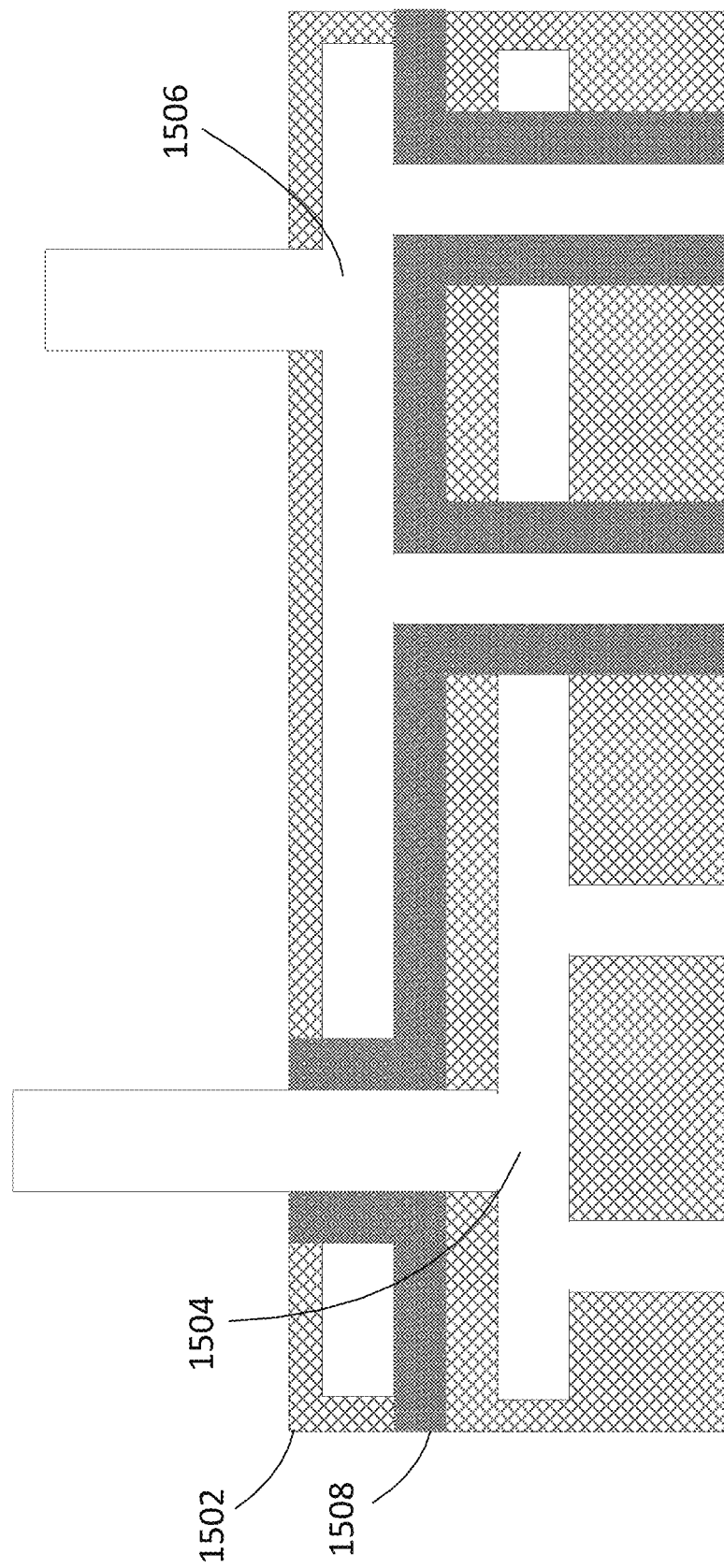
FIG. 15 is another sectional view of an example of a portion of a device package that may be used with the system panel, in accordance with some embodiments of the present disclosure.
Figure 16:
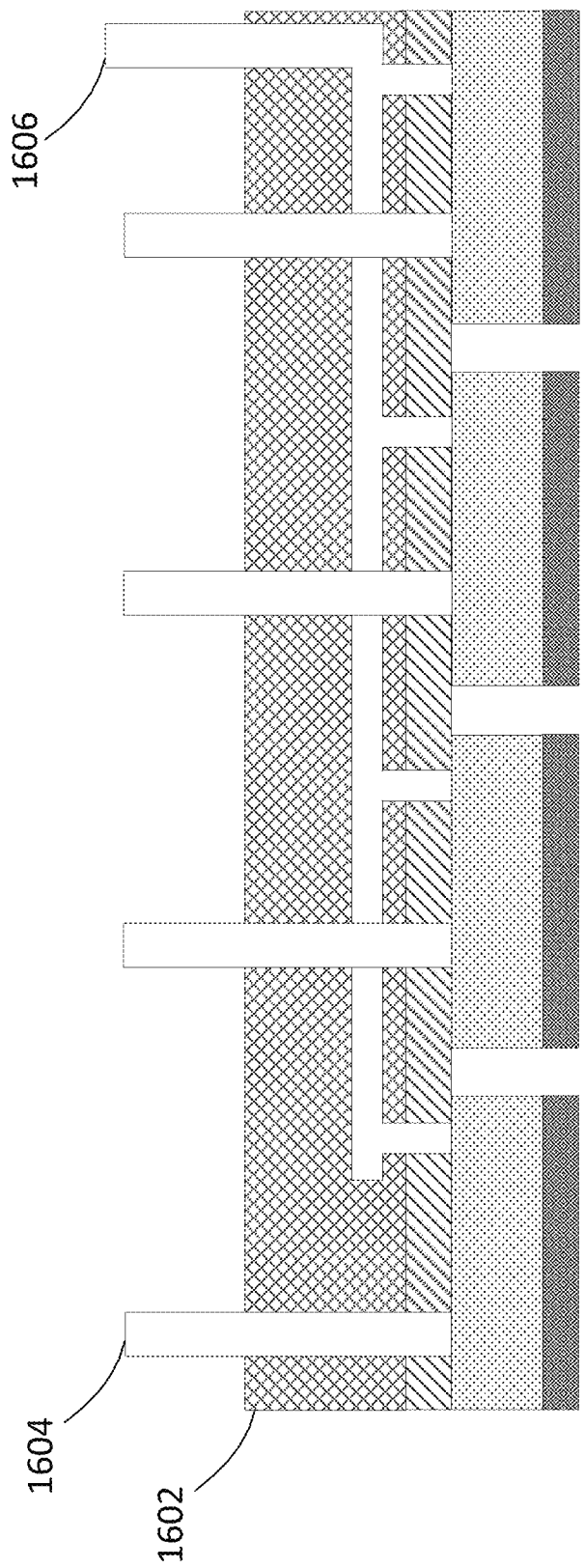
FIG. 16 is another sectional view of an example of a portion of a device package that may be used with the system panel, in accordance with some embodiments of the present disclosure.
Figure 17:
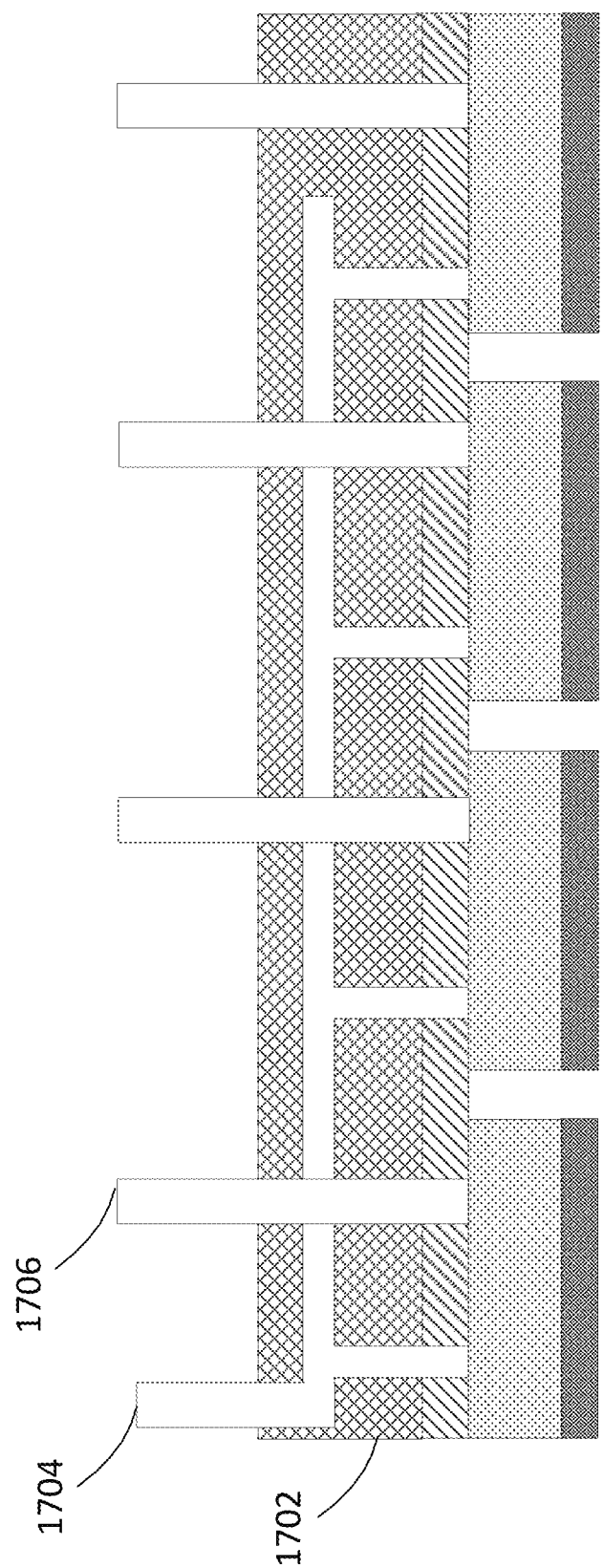
FIG. 17 is another sectional view of an example of a portion of a device package that may be used with the system panel, in accordance with some embodiments of the present disclosure.
Figure 18:
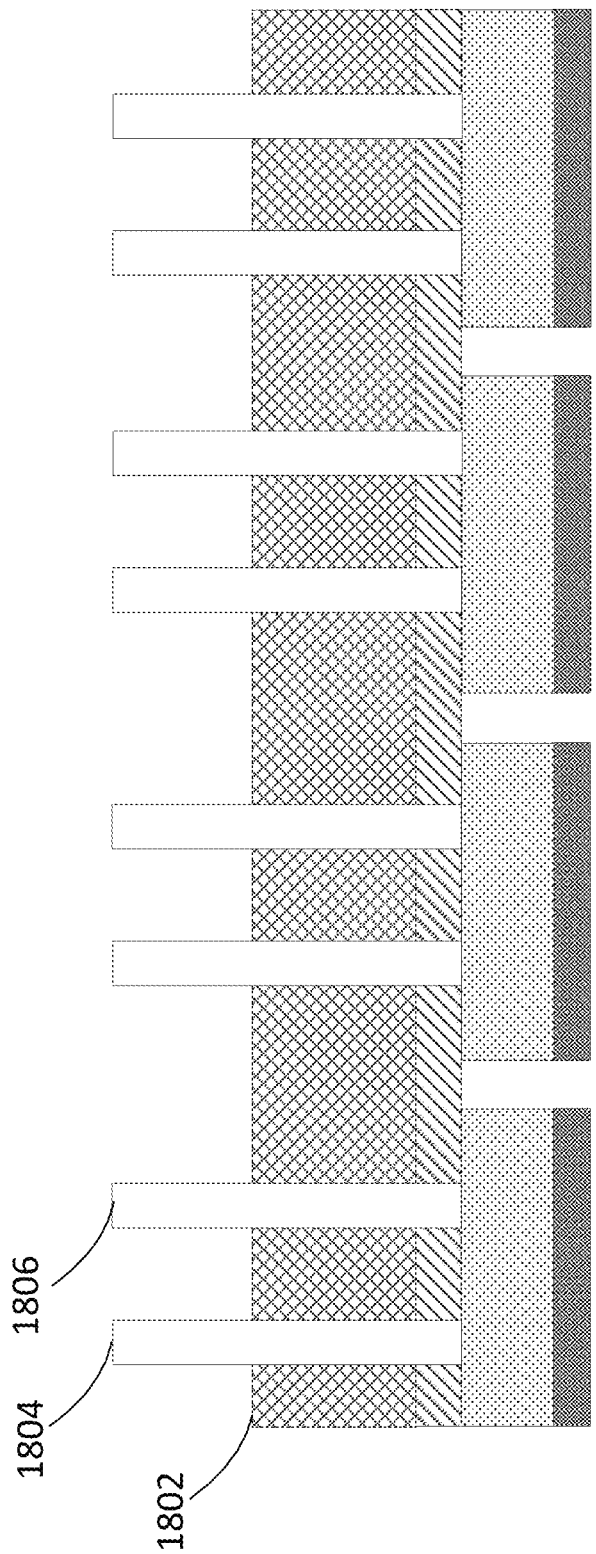
FIG. 18 is another sectional view of an example of a portion of a device package that may be used with the system panel, in accordance with some embodiments of the present disclosure.
Figure 19:
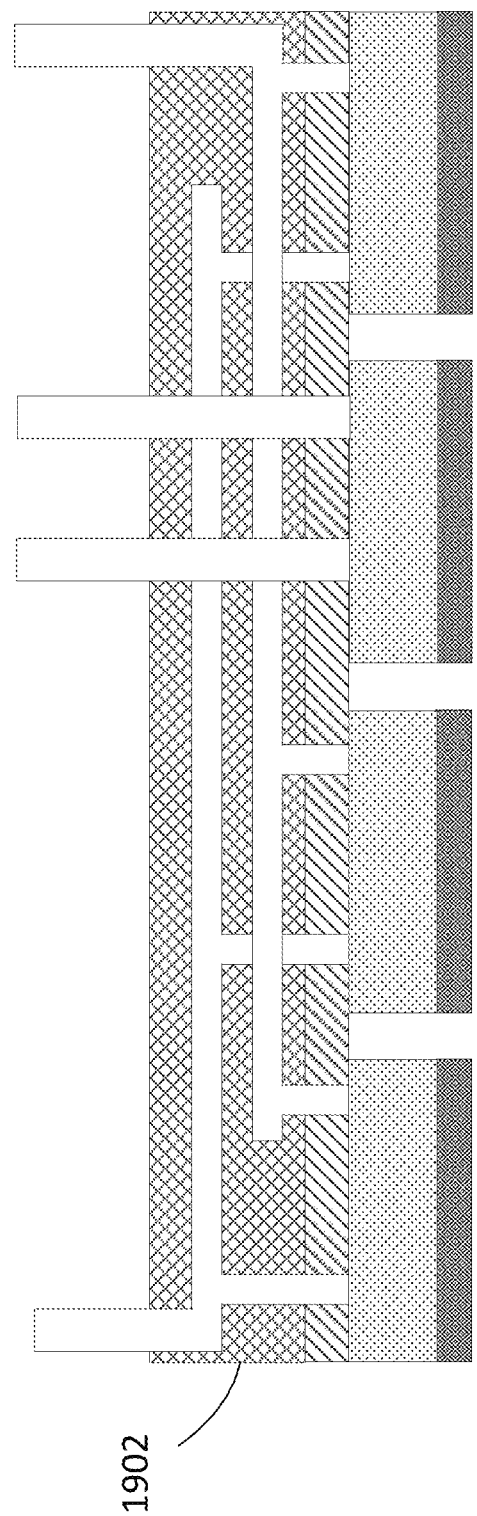
FIG. 19 is another sectional view of an example of a portion of a device package that may be used with the system panel, in accordance with some embodiments of the present disclosure.

FIG. 15 displays a manifold 1502, first coolant chamber volume 1504, and second coolant chamber volume 1506. In some embodiments, the manifold 1502 comprises an insulator layer 1508 surrounding portions of the first coolant chamber volume 1504 and portions of the second coolant chamber volume 1506. In some embodiments, the insulator layer 1508 surrounds portions of the first coolant chamber volume 1504 that overlap with portions of the second coolant chamber volume 1506 in the X, Y, and/or Z direction. In some embodiments, the insulator layer 1508 surrounds portions of the second coolant chamber volume 1506 that overlap with portions of the first coolant chamber volume 1504 in the X, Y, and/or Z direction.

In some embodiments, the manifold 1502 comprises an insulator layer (e.g., similar to insulator layer 1308 of FIG. 13) to increase chip cooling. In some embodiments, the insulator layer is disposed between a portion of the first coolant chamber volume 1504 and a portion of the second coolant chamber volume 1506, reducing heat transfer between the second coolant chamber volume 1506 and the first coolant chamber volume 1504.

FIGS. 16-19 are sectional views of examples of portions of one or more device packages that may be used with the system panel, in accordance with some embodiments of the present disclosure. In some embodiments, FIGS. 16-19 display different manifold designs. In some embodiments, a manifold design may have one or more inlet chamber volumes in parallel and one or more outlet chamber volumes in series. For example, FIG. 16 displays a manifold 1602 with a plurality of inlet chamber volumes (e.g., first inlet chamber volume 1604) in parallel and one or more outlet chamber volumes (e.g., first outlet chamber volume 1606) in series. In some embodiments, a manifold design may have one or more inlet chamber volumes in series and a plurality of outlet chamber volumes in parallel. For example, FIG. 17 displays a manifold 1702 with one or more inlet chamber volumes (e.g., first inlet chamber volume 1704) in series and a plurality of outlet chamber volumes (e.g., first outlet chamber volume 1706) in parallel. In some embodiments, a manifold design may have a plurality of inlet chamber volumes in parallel and a plurality of outlet chamber volumes in parallel. For example, FIG. 18 displays a manifold 1802 with a plurality of inlet chamber volumes (e.g., first inlet chamber volume 1804) in parallel and a plurality of outlet chamber volumes (e.g., first outlet chamber volume 1806) in parallel. In some embodiments, a manifold design may have a combination of inlet chamber volumes in series and parallel and a combination of outlet chamber volumes in series and parallel. For example, FIG. 19 displays a manifold 1902 with a combination of inlet chamber volumes in series and parallel and a combination of outlet chamber volumes in series and parallel.

Figure 20:
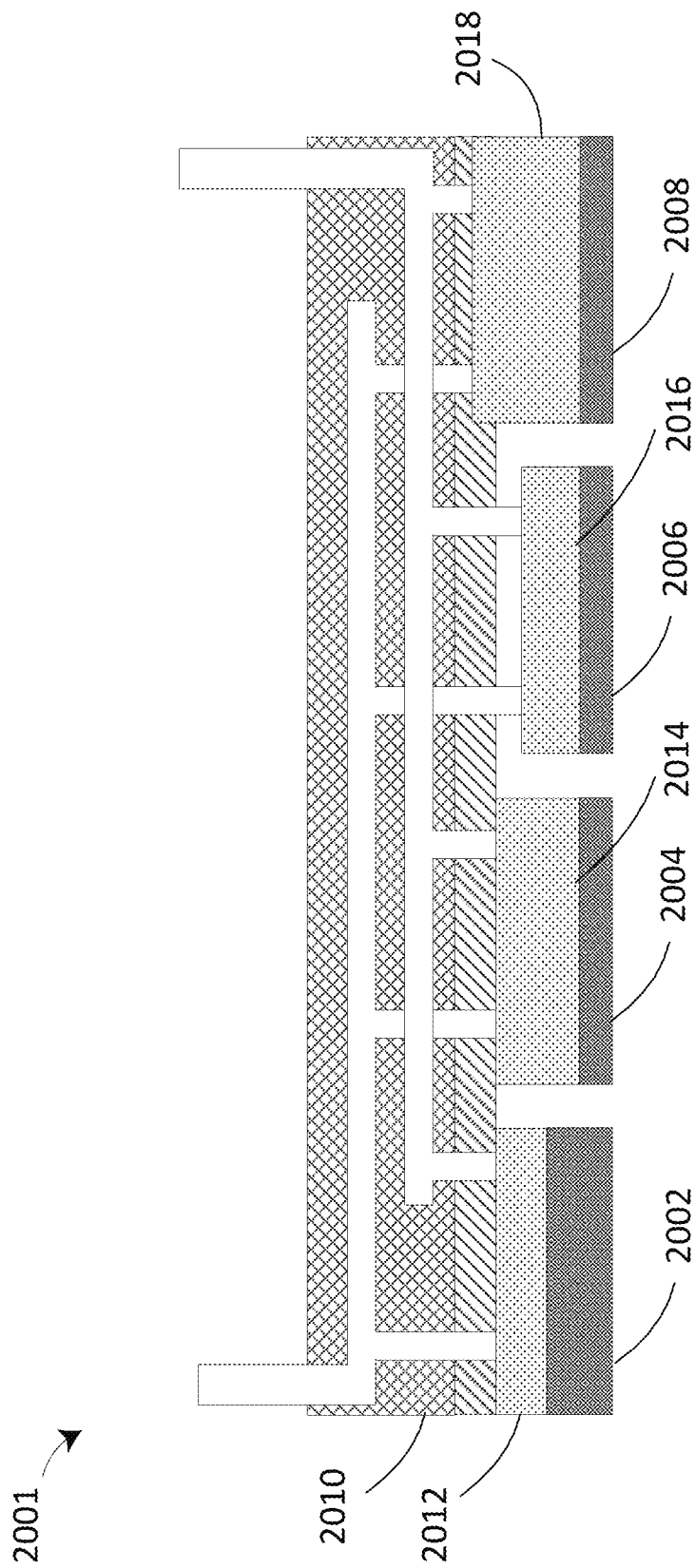
FIG. 20 is another sectional view of an example of a portion of a device package that may be used with the system panel, in accordance with some embodiments of the present disclosure.

FIG. 20 is a schematic side sectional view in the X-Z plane of an example of a device package 2001. In some embodiments, the device package 2001 of FIG. 20 may be similar to the device package 201 described above, and therefore the description of similar features is omitted for brevity. In some embodiments, the device package 2001 comprises a manifold 2010, a first cold plate 2002 coupled to a first semiconductor device 2012, a second cold plate 2004 coupled to a second semiconductor device 2014, a third cold plate 2006 coupled to a third semiconductor device 2016, and a fourth cold plate 2008 coupled to a fourth semiconductor device 2018.

In some embodiments, the manifold 2010 is configured to couple with one or more cold plates, wherein the one or more cold plates extend to the same height. For example, the first cold plate 2002 and the second cold plate 2004 may both extend to a first vertical height and the manifold 2010 may be configured to couple with the first cold plate 2002 and the second cold plate 2004. In some embodiments, the manifold 2010 is configured to couple with one or more cold plates, wherein the one or more cold plates do not extend to the same height. For example, the third cold plate 2006 may extend to a first vertical height and the second cold plate 2004 may extend to a second vertical height. The first vertical height may be different than the second vertical height and the manifold 2010 may be configured to couple with both the third cold plate 2006 and the second cold plate 2004 despite the difference in vertical height. For example, the manifold 210 may have one or more protrusions (e.g., for the third cold plate 2006) or recessions (e.g., for the fourth cold plate 2008) to facilitate coupling with the different vertical heights.

In some embodiments, one or more cold plates are configured according to the thicknesses of one or more semiconductor devices. For example, the first semiconductor device 2012 may have a first thickness and the second semiconductor device 2014 may have a second thickness. The first thickness may be different than the second thickness. In some embodiments, the first cold plate 2002 is designed so that that a first combined thickness of the first cold plate 2002 and the first semiconductor device 2012 is the same or similar to a second combined thickness of the second cold plate 2004 and the second semiconductor device 2014. For example, if the first thickness of the first semiconductor device 2012 is less than the thickness of the second semiconductor device 2014 then the thickness of the first cold plate 2002 may be greater than the thickness of the second cold plate 2004.

In some embodiments, the vertical difference between thicknesses of the first semiconductor device 2012 and the second semiconductor device 2014 is the same or similar to the vertical difference between the thickness of the first cold plate 2002 and the thickness of the second cold plate 2004.

For example, the first thickness of the first semiconductor device 2012 may be 2 mm less the second thickness of the second semiconductor device 2014. In such an example, the thickness of the first cold plate 2002 may be 2 mm greater than the thickness of the second cold plate 2004 so that the combined vertical height of the first semiconductor device 2012 and the first cold plate 2002 is the same or similar to the combined vertical height of the second semiconductor device 2014 and the second cold plate 2004.

The figures herein depict various embodiments of the for purposes of illustration only. It will be appreciated that additional or alternative structures, assemblies, systems, and methods may be implemented within the principles set out by the present disclosure.

The embodiments discussed above are intended to be illustrative and not limiting. One skilled in the art would appreciate that individual aspects of the cooling assemblies, device packages, and methods discussed herein may be omitted, modified, combined, and/or rearranged without departing from the scope of the disclosure.

What is claimed is:

1. A system comprising:
   a first substrate;
   a first semiconductor device located on a first region of the first substrate;
   a second semiconductor device located on a second region of the first substrate;
   a first cold plate attached to the first semiconductor device;
   a second cold plate attached to the second semiconductor device; and
   a manifold having a first chamber and a second chamber, wherein:
   the first chamber comprises:
      a first inlet coupled to a first coolant line;
      a first outlet coupled to the first cold plate attached to the first semiconductor device; and
      a second outlet coupled to the second cold plate attached to the second semiconductor device; and
   the second chamber volume comprises:
      a third outlet coupled to a second coolant line;
      a second inlet coupled to the first cold plate attached to the first semiconductor device; and
      a third inlet coupled to the second cold plate attached to the second semiconductor device.

2. The system of claim 1, wherein:
   the first cold plate is a first vertical distance from the first chamber; and
   the second cold plate is a second vertical distance from the first chamber.

3. The system of claim 2, wherein:
   the first semiconductor device has a first thickness; and
   the second semiconductor device has a second thickness different than the first thickness.

4. The system of claim 1, further comprising an insulator.

5. The system of claim 4, wherein the insulator is directly adjacent to the first chamber.

6. The system of claim 5, wherein the insulator is directly adjacent to the first outlet coupled to the first cold plate and the second outlet coupled to the second cold plate.

7. The system of claim 4, wherein the insulator is directly adjacent to the second chamber.

8. The system of claim 7, wherein the insulator is directly adjacent to the second inlet coupled to the first cold plate and the third inlet coupled to the second cold plate.

9. The system of claim 1, further comprising a package cover attached to the first substrate.

10. The system of claim 9, wherein the package cover is between the manifold and the first substrate.

11. The system of claim 9, wherein the manifold is between the package cover and the first substrate.

12. The system of claim 1, wherein the first cold plate is attached to the first semiconductor device by direct dielectric bonds.

13. The system of claim 1, wherein the first cold plate is attached to the first semiconductor device by direct hybrid bonds.

14. A cooling manifold comprising:
   a first chamber comprising:
      a first inlet coupled to a first coolant line;
      a first outlet coupled to a first cold plate of a first semiconductor device; and
      a second outlet coupled to a second cold plate of a second semiconductor device; and
   a second chamber comprising:
      a third outlet coupled to a second coolant line;
      a second inlet coupled to the first cold plate of the first semiconductor device; and
      a third inlet coupled to the second cold plate of the second semiconductor device.

15. The cooling manifold of claim 14, wherein the cooling manifold is attached to a device package using an adhesive.

16. The cooling manifold of claim 14, wherein the cooling manifold is located within a device package.

17. The cooling manifold of claim 14, wherein:
   the first cold plate is a first vertical distance from the first chamber; and
   the second cold plate is a second vertical distance from the first chamber.

18. The cooling manifold of claim 17, wherein:
   the first semiconductor device has a first thickness; and
   the second semiconductor device has a second thickness different than the first thickness.

19. The cooling manifold of claim 17, further comprising an insulator.

20. The cooling manifold of claim 19, wherein the insulator is directly adjacent to the first chamber.

* * * * *